US012721141B2

(12) United States Patent
Takahashi

(10) Patent No.: US 12,721,141 B2
(45) Date of Patent: Aug. 25, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventor: Yukio Takahashi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 1022 days.

(21) Appl. No.: 17/870,195

(22) Filed: Jul. 21, 2022

(65) Prior Publication Data

US 2023/0064636 A1 Mar. 2, 2023

(30) Foreign Application Priority Data

Sep. 1, 2021 (JP) ................................ 2021-142317

(51) Int. Cl.
*H10W 20/42* (2026.01)
*H10P 52/00* (2026.01)
(Continued)

(52) U.S. Cl.
CPC ............ *H10W 20/42* (2026.01); *H10P 52/00* (2026.01); *H10W 20/077* (2026.01);
(Continued)

(58) Field of Classification Search
CPC ............ H01L 23/5226; H01L 21/3043; H01L 21/76805; H01L 21/76816;
(Continued)

(56) References Cited

U.S. PATENT DOCUMENTS 9,023,717 B2 5/2015 Nakagawa et al.
9,087,891 B2 * 7/2015 Yoshizawa ........... H10P 74/277
(Continued)

FOREIGN PATENT DOCUMENTS

JP 2006-202848 A 8/2006
JP 2007-189111 A 7/2007
(Continued)

OTHER PUBLICATIONS

Office Action dated Nov. 19, 2024, issued in corresponding Japanese Patent Application No. 2021-142317, 16 pages.

*Primary Examiner* — Benjamin Tzu-Hung Liu
(74) *Attorney, Agent, or Firm* — RIMON P.C.

(57) ABSTRACT

A first conductor pattern is formed on a semiconductor substrate of a scribing region via an insulating film. A plurality of second conductor patterns connected to the first conductor pattern are formed on the first conductor pattern. A third conductor pattern connected to the plurality of second conductor patterns is formed on the plurality of second conductor pattern. The scribing region is cut off in a Y direction by using a dicing blade so that a part of the scribing region is left in a chip region. In an X direction, a width of the dicing blade is narrower than each width of the first and second conductor patterns. After cutting off the scribing region, a part of the first conductor pattern, all or a part of at least one of the plurality of second conductor patterns, and a part of the third conductor pattern are left in the scribing region.

14 Claims, 24 Drawing Sheets

(51) Int. Cl.
*H10W 20/00* (2026.01)
*H10W 20/40* (2026.01)
*H10W 20/44* (2026.01)

(52) U.S. Cl.
CPC ....... *H10W 20/083* (2026.01); *H10W 20/089* (2026.01); *H10W 20/4407* (2026.01)

(58) Field of Classification Search
CPC ....... H01L 21/76834; H01L 23/53219; H10W 20/42; H10W 20/077; H10W 20/083; H10W 20/089; H10W 20/4407; H10P 52/00
See application file for complete search history.

(56) References Cited

U.S. PATENT DOCUMENTS

| | | | | |
|---|---|---|---|---|
| 9,691,811 | B1* | 6/2017 | Borthakur | H10F 39/809 |
| 2005/0151190 | A1* | 7/2005 | Kotek | H10D 30/668 257/341 |
| 2006/0157762 | A1* | 7/2006 | Hikosaka | H10B 53/30 257/295 |
| 2008/0083923 | A1 | 4/2008 | Nakauchi | |
| 2009/0272973 | A1 | 11/2009 | Yoshida et al. | |
| 2012/0313217 | A1* | 12/2012 | Hung | H10W 42/00 257/532 |
| 2013/0069206 | A1* | 3/2013 | Yoshizawa | H01L 21/78 257/E23.179 |
| 2015/0079762 | A1 | 3/2015 | Nakagawa et al. | |
| 2018/0197825 | A1* | 7/2018 | Yoshida | H10D 12/038 |
| 2020/0403089 | A1* | 12/2020 | Ikura | H10D 64/513 |
| 2023/0064636 | A1* | 3/2023 | Takahashi | H10D 12/481 |

FOREIGN PATENT DOCUMENTS

| | | | |
|---|---|---|---|
| JP | 2007189111 | * | 7/2007 |
| JP | 2008-098225 | A | 4/2008 |
| JP | 2011-124487 | A | 6/2011 |
| JP | 2015-056605 | A | 3/2015 |
| JP | 2016-184745 | A | 10/2016 |
| JP | 2021-002620 | A | 1/2021 |

* cited by examiner

BEFORE DICING STEP

AFTER DICING STEP

*FIG. 2*

1A
2A
RP1
SI
GF
TR
PF
ND
SUB
NHB
X
Y
Z 1A
2A
SUB
GF
PB
GE
(GEa)
TR
PF
ND
NE
NHB
GE
(GEb)
Z
X
Y 1A
2A
IL
GF
PB
GE
(GEa)
TR
PF
ND
SUB
NE
PB
NHB
GE
(GEb)
X
Y
Z 2A
1A
SUB
IL
GF
PB
GE
(GEa)
TR
PF
ND
NE
VH2
PR
NHB
VH1
GE
(GEb)
Z
X
Y 2A
1A
SUB
IL
GF
PB
GE (GEa)
TR
PF
ND
NE
PB
VIA2
VH2
PR
NHB
VIA1
VH1
GE (GEb)
Z
X
Y 1A
2A
GW
EW
IL
GF
PB
GE (GEa)
TR
PF
ND
SUB
VIA1
VH1
GE (GEb)
NE
PB
VIA2
VH2
PR
NHB
Z
X
Y 1A
2A
VH1
VIA1
NE
VH2
VIA2
NE
PB
PIQ
GW
EW
IL
GE
(GEb)
GF
PB
GE
(GEa)
TR
PF
ND
NS
PC
CE
SUB
NHB
PR
Z
Y
X 3A
1A
PIQ
RW
IL
RE
GF
PF
ND
NS
PC
CE
SUB
VIA3
VH3
GW
GE
(GEa)
TR
VIA1
VH1
Z
X
Y

SEMICONDUCTOR DEVICE AND METHOD OF MANUFACTURING THE SAME

CROSS-REFERENCE TO RELATED APPLICATION

The present application claims priority from Japanese Patent Application No. 2021-142317 filed on Sep. 1, 2021, the content of which is hereby incorporated by reference into this application.

BACKGROUND

The present invention relates to a semiconductor device and a method of manufacturing the same, particularly, to a semiconductor device having a conductor pattern in a scribing region and its manufacturing method.

Conventionally performed is a method in which a semiconductor wafer is cut off by a dicing blade or the like along a scribing region of the semiconductor wafer to individuate the semiconductor wafer and acquire a plurality of semiconductor chips. Further, in order to effectively utilize the scribing region, the scribing region is provided with a test pattern(s).

For example, patent Document 1 (Japanese Patent Application Laid-open No. 2011-124487) discloses a technique in which conductor patterns for test are formed in a scribing region and all the conductor patterns are cut off by a dicing blade having a larger width than a width of a metal pattern.

Further, Patent Document 2 (Japanese Patent Application Laid-open No. 2015-056605) discloses a technique in which a plurality of rows of metal patterns are formed in a scribing region and are cut off by a dicing blade having a larger width than a width of the metal pattern. Incidentally, the metal pattern is composed of a multilayer wiring layer in which a wiring(s) and a plug(s) are stacked.

SUMMARY

FIG. 1 shows a scribing region of a semiconductor device in an examination example that the inventor of the present application has examined. In the scribing region, an insulating film IL is formed on a semiconductor substrate SUB, and a conductor pattern CP0 is formed on the insulating film IL. Although not illustrated in detail, a plurality of inspection elements are formed on the semiconductor substrate SUB and a conductor pattern CP0 is, for example, WAT (Water Acceptor Test) or the like is provided as a measuring pad that the inspection elements are caused to contact with. Incidentally, a chip region, on which a transistor or the like is formed, is covered with a protective film PIQ such as a polyimide film, but if the protective film PIQ exists in the scribing region, a dicing step is different to perform and so the scribing region is exposed from the protective film PIQ.

Generally, as shown in FIG. 1, in order to individuate the semiconductor substrate SUB and acquire the plurality of semiconductor devices, performed is a dicing step of cutting off the scribing region by a dicing blade DC. At this time, in the scribing region, a part of the cut-off conductor pattern CP0 is left as a conductor pattern piece CP0*a*. Here, since the conductor pattern CP0 is not covered with the protective film PIQ or the like, the left conductor pattern piece CP0*a* is peeled off from the insulating film IL and may be flown off as foreign matters to a chip region.

In particularly, regarding a discrete device in many cases, the number of wiring layers is one. At this case, the wiring pattern(s) other than the semiconductor pattern CP0 lead to being not present in the scribing region. Therefore, the left conductor pattern piece CP0*a* is in a status of easily peeled off from the insulating film IL.

The foreign matters as mentioned above is then detected by an appearance inspection or the like, and the semiconductor device is determined as a defective product. That is, a yield of the semiconductor device is reduced. Further, the defection may be difficult depending on a degree of attachment to the foreign matters. At this case, the semiconductor device with low reliability leads to being manufactured since the foreign matters act as leak paths or the like.

In order to prevent such a status, downsizing the semiconductor device is conceivable so that a width of the conductor pattern CP0 is narrower than a width of the dicing blade DC. This makes it possible to remove all of the semiconductor pattern CP0 at a dicing step. However, if the width of the conductor pattern CP0 is narrowed, a contacting area between an inspection terminal and the conductor pattern becomes small and a problem may arise in that accuracy of a measured result is deteriorated. Alternatively, since positioning the inspection terminal is also difficult, a problem may arise in that stability of the measurement is deteriorated.

Meanwhile, it is conceivable that, by widening the width of the scribing region and applying the wide dicing blade DC, all the conductor patterns are removed without deteriorating the accuracy of the measured result and the stability of the measurement. However, there arises a problem in that, by widening the width of the scribing region, a size of a chip becomes larger and the number of chips to be acquired becomes less.

A main object of the present application is to provide a technique capable of preventing the conductor pattern piece CP0*a* from being flown off without applying a method of downsizing the conductor pattern CP0, a method of widening the width of the scribing region, or the like. That is, the main object of the present application is to improve reliability of the semiconductor device and suppress a reduction in the yield of the semiconductor device.

Other problems and novel features will be apparent from the description of the present specification and the accompanied drawings.

A method of manufacturing a semiconductor device, which is one embodiment, includes:

(a) preparing a semiconductor substate having a first chip region, a second chip region, and a scribing region that is provided between the first and second chip regions and extends in a first direction in a plan view;

(b) forming a first conductor pattern via a first insulating film on the semiconductor substate of the scribing region;

(c) forming a second insulating film covering the first conductor pattern;

(d) forming a plurality of holes in the second insulating film so as to be located on the first conductor pattern;

(e) forming a plurality of second conductor patterns connected to the first conductor pattern in the plurality of holes;

(f) forming a third conductor pattern connected to the plurality of second conductor patterns on the second insulating film and on the plurality of second conductor patterns; and (g) cutting off the scribing region along the first direction by using a dicing blade so that a part of the scribing region is left in each outer periphery of the first chip region and the second chip region. Here, in a second direction intersecting with the first direction as a plan view, a width of the dicing blade is narrower than a width of the first conductor pattern and a width of the third conductor pattern before the (g). Further, after the (g), a part of the first conductor patter, all or a part of at least one of the plurality of second conductor patterns. Furthermore, a part of the third conductor pattern are left in each of the scribing region on a side of the first chip region and the scribing region on a side of the second chip region.

A semiconductor device, which is one embodiment, includes:

- a semiconductor substrate having a first region for forming a transistor and a scribing region surrounding an outer periphery of the first chip region;
- a gate insulating film formed on the semiconductor substrate of the first chip region;
- a first insulating film formed on the semiconductor substrate of the scribing region;
- a gate electrode formed on the gate insulating film;
- a first conductor pattern piece formed on the first insulating film;
- a second insulating film covering the gate electrode and the first conductor pattern;
- a via-hole formed in the second insulating film so as to be located on the gate electrode;
- a hole formed in the second insulating film so as to be located on the first conductor pattern piece;
- a via formed in the via-hole and connected to the gate electrode;
- a second conductor patter piece formed in the hole and connected to the first conductor pattern;
- a gate wiring formed on the second insulating film and the via and connected to the via; and
- a third conductor pattern piece formed on the second insulating film and the second conductor pattern piece and connected to the second conductor pattern piece.

A method of manufacturing a semiconductor device, which is one embodiment, includes:

- (a) preparing a semiconductor substrate with a first conductivity type, the semiconductor substrate having a first chip region, a second chip region, and a scribing region that is provided between the first chip region and the second chip region and extends in a first direction in a plan view;
- (b) forming a seventh conductor pattern in the semiconductor substrate of the scribing region, the seventh conductor pattern having a second conductivity type opposite to the first conductivity type;
- (c) forming a second insulating film so as to cover the seventh conductor pattern;
- (d) forming a plurality of holes in the second insulating film so as to be located on the seventh conductor pattern;
- (e) forming, in the plurality of holes, a plurality of second conductor patterns connected to the seventh conductor pattern;
- (f) forming, on the second insulating film and the plurality of second conductor patterns, a third conductor pattern connected to the plurality of second conductor patterns; and
- (g) using a dicing blade to cut off the scribing region along the first direction so that a part of the scribing region is left on an outer periphery of each of the first chip region and the second chip region. Here, in a second direction intersecting with the first direction in a plan view, a width of the dicing blade is narrower than a width of the seventh conductor pattern and a width of the third conductor pattern before the (g). Further, after the (g), a part of the seventh conductor patter, at least one of the plurality of second conductor patterns. Furthermore, a part of the third conductor pattern are left in each of the scribing region on a side of the first chip region and the scribing region on a side of the second chip region.

According to one embodiment, it is possible to improve the reliability of the semiconductor device and suppress the reduction in the yield of the semiconductor device.

BRIEF DESCRIPTION OF THE DRAWINGS

FIG. 2 is a plan drawing showing a semiconductor substrate in a first embodiment.

DETAILED DESCRIPTION

Figure 1:
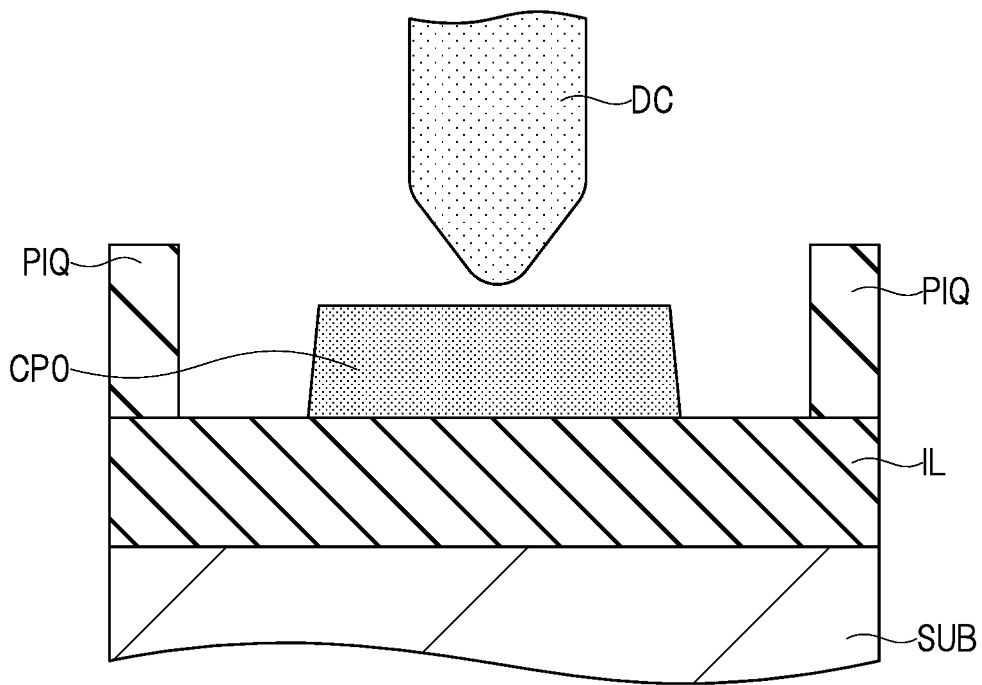
FIG. 1 is a sectional view showing a scribing region of a semiconductor device in an examination example.
Figure 1:
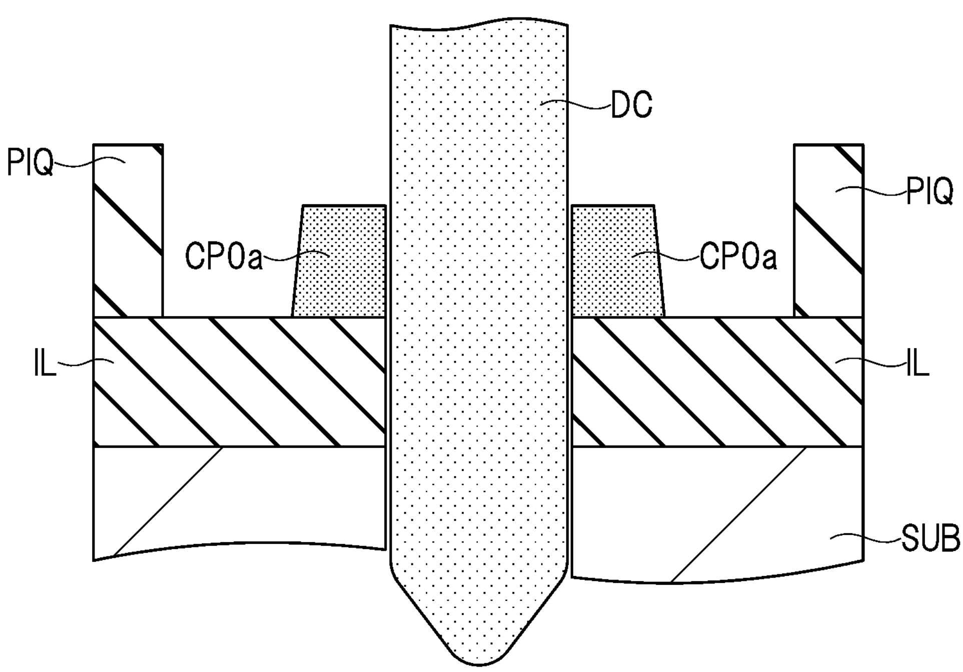

Hereinafter, embodiments of the present invention will be described in detail with reference to the accompanying drawings. Note that components having the same function are denoted by the same reference characters throughout the drawings for describing the embodiments, and a repetitive description thereof will be omitted. In addition, the description of the same or similar portions is not repeated in principle unless particularly required in the following embodiments.

Further, an X direction and a Y direction explained in the present application intersect with each other and are orthogonal to each other. In the present application, a Z direction will be described as an up-down direction of a structure, a height direction, or a width direction. In addition, an expression “plan drawing”, “plan view”, or the like means that a face composed of the X direction and the Y direction is referred to as “plan” and the “plan” is viewed from the Z direction.

First Embodiment

<Configuration of Semiconductor Device>

Figure 2:
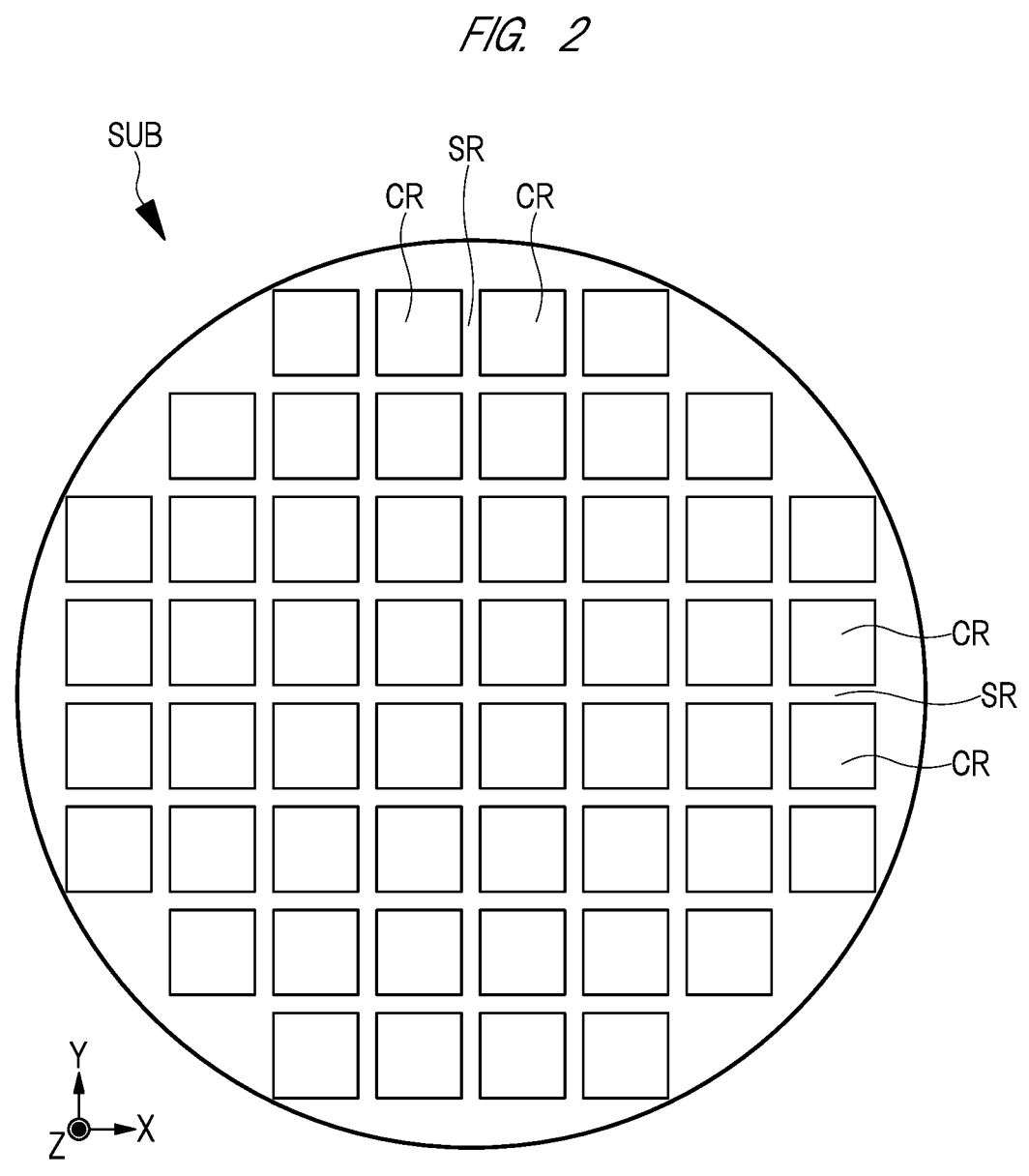
Figure 6:
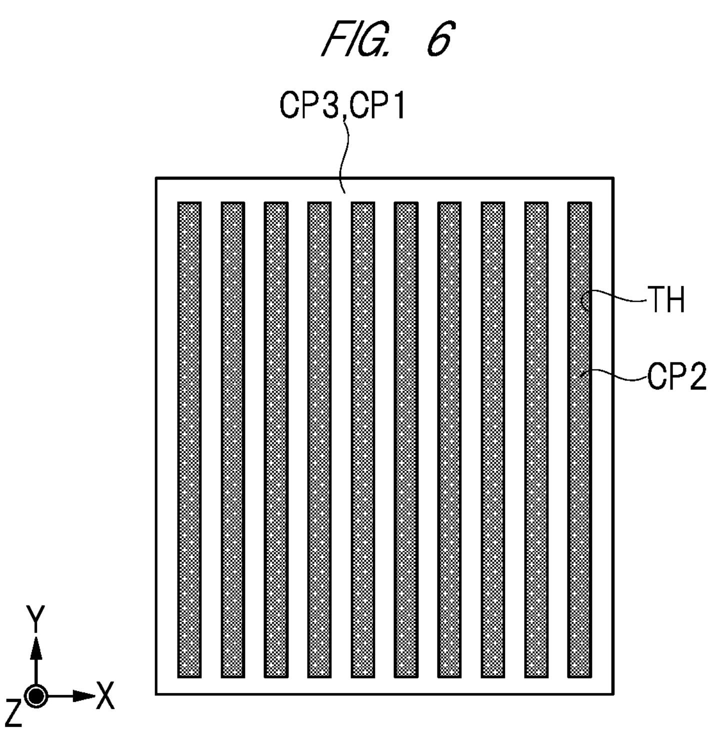
FIG. 6 is a plan drawing showing conductor patterns in the first embodiment.
Figure 7:
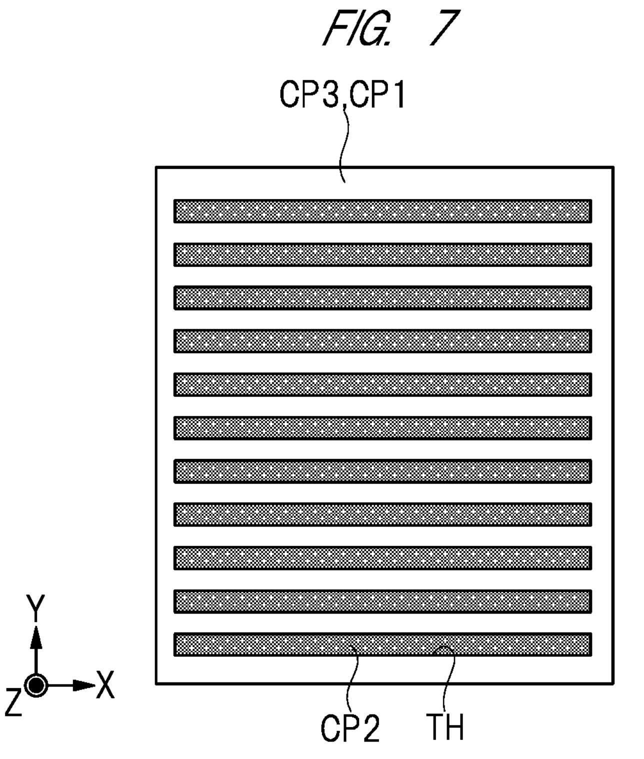
FIG. 7 is a plan drawing showing conductor patterns in the first embodiment.
Figure 8:
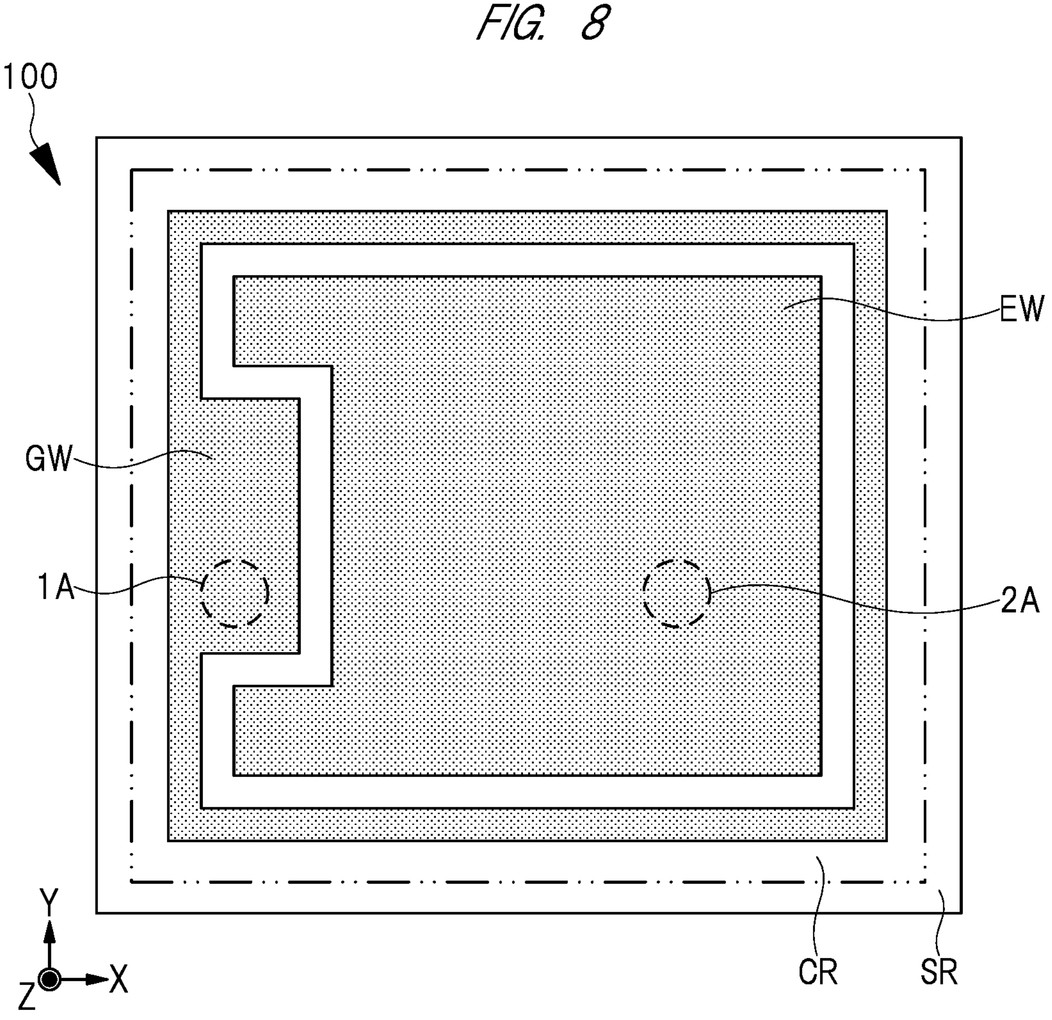
FIG. 8 is a plan drawing showing a semiconductor device in the first embodiment.
Figure 9:
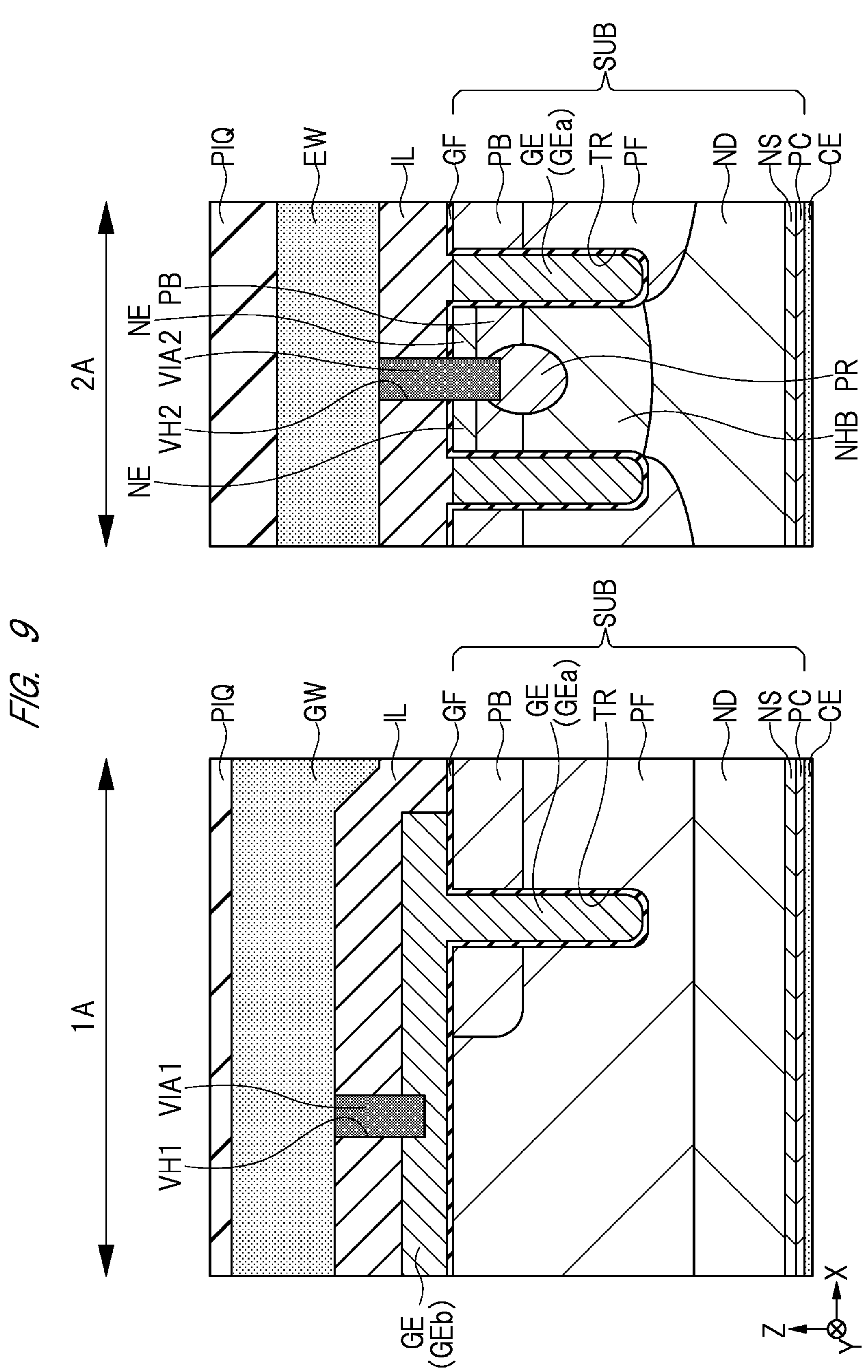
FIG. 9 is a sectional view showing a chip region of the semiconductor device in the first embodiment.

Hereinafter, a semiconductor device 100 in a first embodiment will be described with reference to FIGS. 2 to 9. FIG. 2 shows a semiconductor substrate SUB used in the first embodiment, and FIGS. 3 to 7 show conductor patterns CP1 to CP3 formed in a scribing region SR. FIGS. 8 and 9 each show a transistor formed in a chip region CR.

As shown in FIG. 2, a semiconductor substrate SUB is made of, for example, silicon, and has a plurality of chip regions CR and a scribing region SR provided of the respective chip regions CR. The chip region CR is a region in which a semiconductor element such as a transistor is mainly formed. The scribing region SR extends in the X direction and the Y direction in a plan view. By using a dicing blade DC to cut off the scribing region SR along the X direction and the Y direction, a plurality of semiconductor devices 100 having the chip regions CR and a part of the scribing region SR are acquired.

Figure 3:
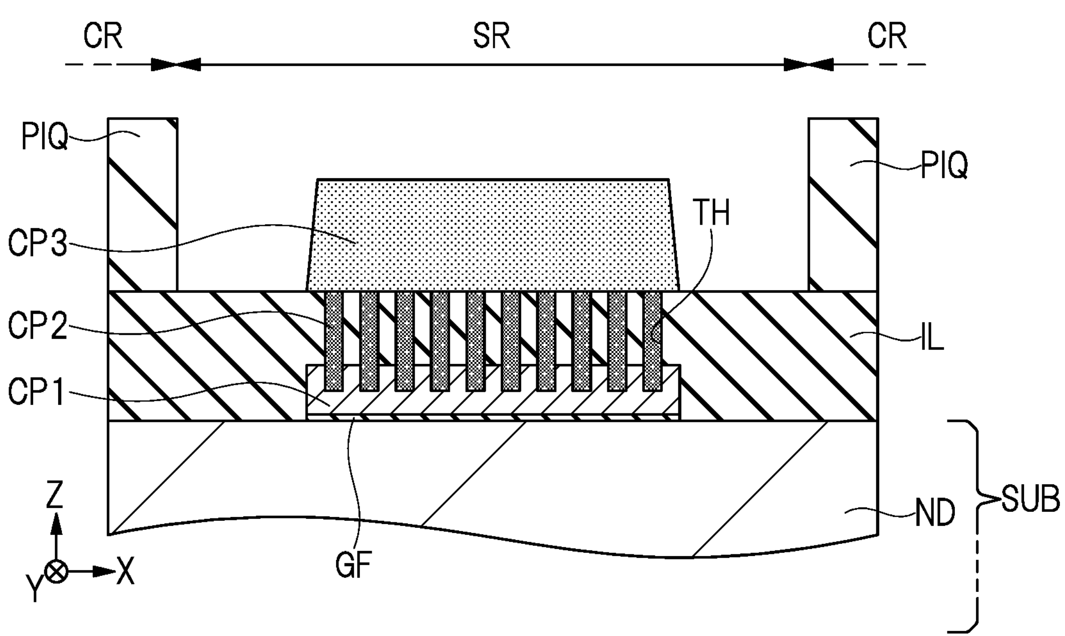
FIG. 3 is a sectional view showing a scribing region of the semiconductor device in the first embodiment.
Figure 4:
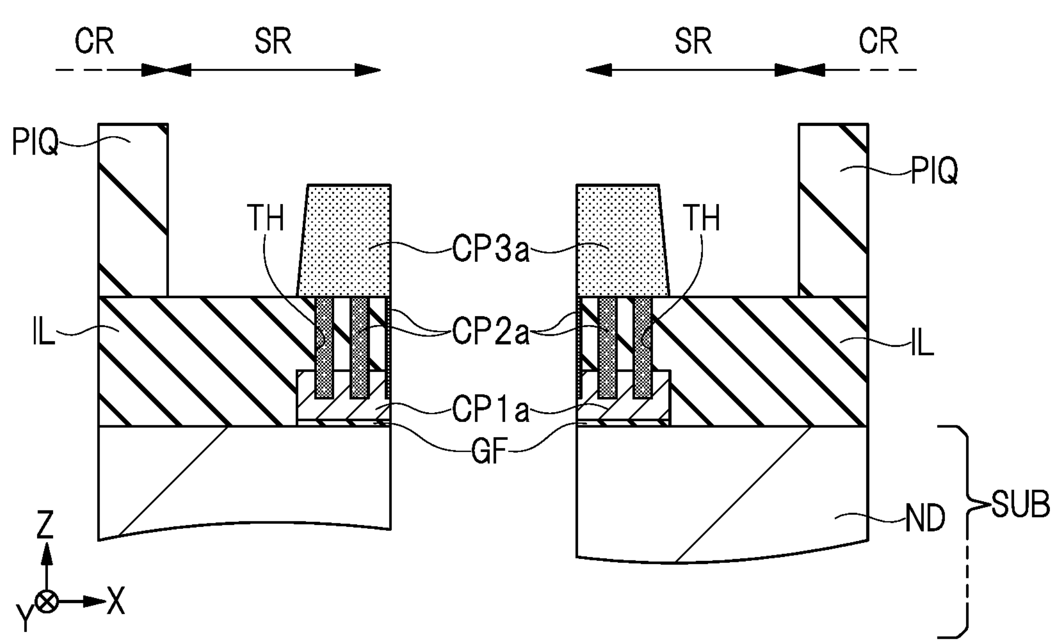
FIG. 4 is a sectional view showing a scribing region of the semiconductor device in the first embodiment.

FIG. 3 shows a state of the scribing region SR before the dicing step that is performed by using the dicing blade DC, and FIG. 4 shows a state of the scribing region SR after the dicing step.

As shown in FIG. 3, formed on the semiconductor substrate SUB of the scribing region SR is a drift region ND that has an n-type impurity region with low concentration. On the semiconductor substrate SUB of the scribing region SR, an insulating film GF made of, for example, an oxide silicon film is formed. A thickness of the insulating film GF is, for example, 50 to 1000 nm. On the insulating film GF, a conductor pattern CP1 made of, for example, an n-type polycrystalline silicon film is formed. A thickness of the conductor pattern CP1 is, for example, 400 to 800 nm. The conductor pattern CP1 is covered with an insulating film IL made of, for example, oxide silicon film. A thickness of the insulating film IL is, for example, 400 to 1000 nm.

A plurality of holes TH are formed on the insulating film IL so as to be located over or on the conductor pattern CP1. Formed in the plurality of holes TH are a plurality of conductor patterns CP2 that are each connected to the conductor pattern CP1. The conductor pattern CP2 contains, as a main conductor film, a tungsten film. Specifically, the conductor pattern CP2 is made of a stacked layer that contains a barrier metal film such as a titan film or a nitride titan film, and a conductor film such as a tungsten film formed on the barrier metal film.

Formed on the plurality conductor patterns CP2 is a conductor pattern CP3 that is connected to each of the plurality of conductor patterns CP2. The conductor pattern CP3 contains, as a main conductor film, an aluminum film. Specifically, the conductor pattern CP3 is made of a stacked film that contains a barrier metal film such as a tungsten titanium film, a titanium nitride film, or titanium tungsten film, and a conductor film such as an aluminum film or an aluminum alloy film formed on the barrier metal film. A thickness of the conductor pattern CP3 is, for example, 0.5 to 6 μm.

Further, formed on the insulating film IL is a protective film PIQ made of, for example, a polyimide film. The protective film PIQ has an opening for opening the scribing region SR, and the scribing region SR is exposed from the protective film PIQ.

As shown in FIG. 4, after the dicing step, a part of the scribing region SR is left at an outer periphery of each chip region CR. In the scribing region, a part of the conductor pattern CP1, all or a part of at least one conductor pattern CP2 of (among) the plurality of conductor patterns CP2, and a part of conductor pattern CP3 are left as a conductor pattern piece CP1*a*, a conductor pattern piece CP2*a*, and a conductor pattern piece CP3*a*.

Figure 5:
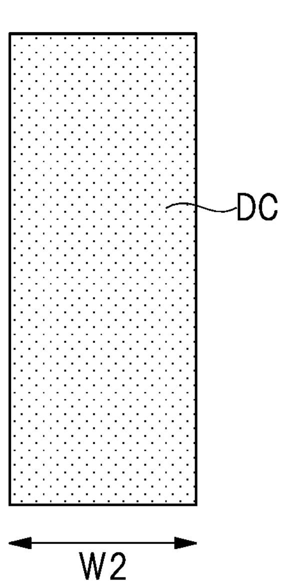
FIG. 5 is a sectional view showing a scribing region of the semiconductor device in the first embodiment.
Figure 5:
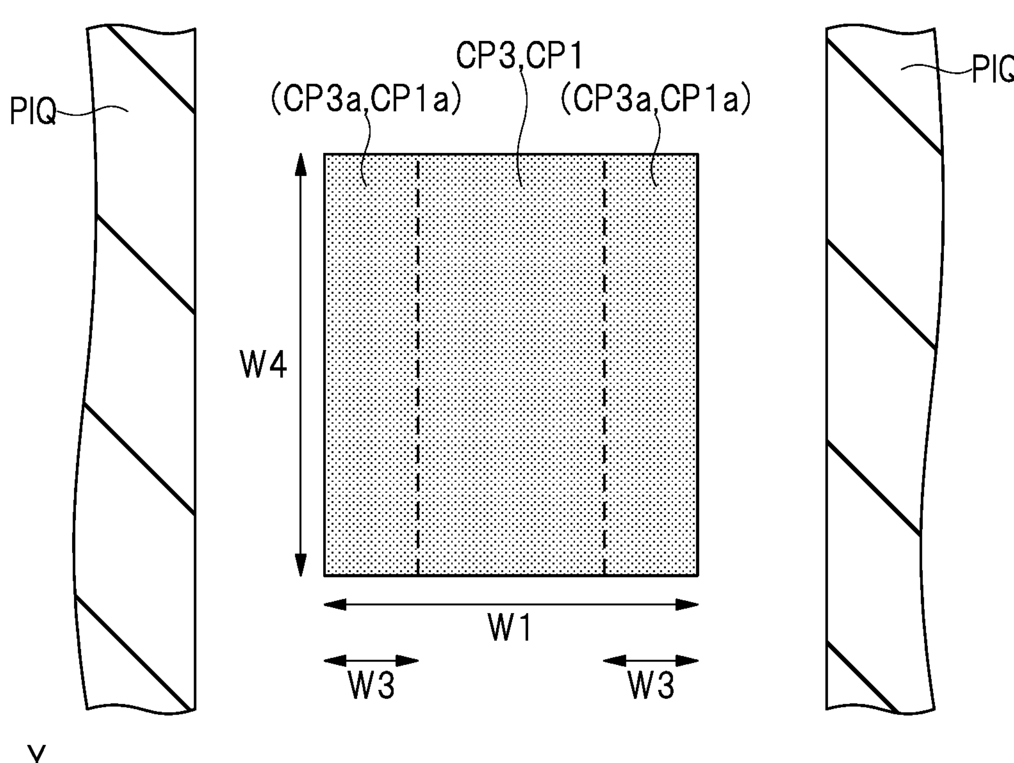
Figure 5:
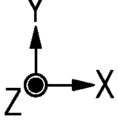

FIG. 5 shows a case where the dicing step is performed by using the dicing blade DC along the Y direction with respect to the scribing region extending in the Y direction, and shows a relationship between a width of each conductor pattern and a width of the dicing blade DC.

As shown in FIG. 5, in the X direction, a width W2 of the dicing blade DC becomes narrower than a width W1 of the conductor pattern CP1 and a width W1 of the conductor pattern CP3 before the dicing step. In the X direction, the width W1 of the conductor pattern CP1 and the width W1 of the conductor pattern CP3 before the dicing step are each twice or larger than the width W2 of the dicing blade DC. Further, in the X direction, a width W3 of the conductor pattern piece CP1*a* and a width W3 of the conductor pattern piece CP3*a* after the dicing step are each one half or larger than the width W2 of the dicing blade DC.

Further, after the dicing step, a width W4 of the conductor pattern piece CP1*a* and a width W4 of the conductor pattern piece CP3*a* in the Y direction are each wider (larger) than a width W3 of the conductor pattern piece CP1*a* and a width W3 of the conductor pattern piece CP3a in the X direction. Making the width W4 larger than the width W3 makes it possible to increase the number of locations where the conductor pattern piece CP2a is left after the dicing step. Consequently, jointing strength of the conductor pattern pieces CP1a to CP3a can be further enhanced.

Incidentally, the width W1 is, for example, 60 μm or more. The width W2 is, for example, 30 μm or more. The width W3 is, for example, 15 μm or more. The width W4 is, for example, 60 μm or more.

In the first embodiment in this way, the width W1 of the conductor pattern CP1 and the width W1 of the conductor pattern CP3 are set so as to become wider. Consequently, for example, in applying the conductor patterns CP1 to CP3 as a measuring pad, a contact area between an inspection element and the conductor pattern CP3 can be increased, so that accuracy of a measurement result can be improved. Further, since position adjustment of the inspection element become also easy, stability of the measurement is improved.

Further, in order to remove all of the conductor patterns CP1 to CP3, the first embodiment does not adopt a method of widening the width W2 of the dicing blade and further widening the width of the scribing region SR. Consequently, solved can be a problem of an increase in size of the chip or a problem of a reduction in the number of chips to be acquired.

Meanwhile, in the first embodiment, the parts of the conductor patterns CP1 to CP3 lead to be left in the scribing region SR. At this case, in the examination example as shown in FIG. 1, the left conductor pattern piece CP0a is peeled off from the insulating film IL and may fly off (scatter), as foreign matters, into the scribing region.

In contrast thereto, in the first embodiment, after the dicing step, the part of the conductor pattern CP1, all or the part of at least one conductor pattern CP2 of the plurality of conductor patterns CP2, and the part of the conductor pattern CP3 are left as the conductor pattern piece CP1a, the conductor pattern piece CP2a, and the conductor pattern piece CP3a. That is, under a state where the conductor pattern piece CP3a is connected to the conductor pattern piece CP2a and the conductor pattern piece CP1a, the conductor pattern pieces CP1a to CP3a are left in the scribing region SR.

Therefore, the first embodiment has an effect in which the conductor pattern piece CP3a is difficult to peel off from the insulating film IL. That is, according to the first embodiment, since the conductor pattern piece CP3a can be prevented from being flown off, it is possible to improve the reliability of the semiconductor device 100 and suppress the reduction in yield of the semiconductor device 100.

Incidentally, FIG. 4 exemplifies a case in which two conductor pattern pieces CP2a and their parts are left in the scribing region SR. However, the number of left conductor patterns piece CP2a is not limited thereto. It is important that a conductor for connecting the conductor pattern piece CP3a and the conductor pattern piece CP1a is left in the scribing region SR.

Further, in FIGS. 3 and 4, the plurality of holes TH are formed from an upper surface of the conductor pattern CP1 (conductor pattern piece CP1a) to a position where it reaches its inside. That is, the conductor pattern CP2 (the conductor pattern piece CP2a) is formed from the upper surface of the conductor pattern CP1 (the conductor pattern piece CP1a) to the position where it reaches its inside. Consequently, the joint strength between each of the plurality of conductor patterns CP2 and the conductor pattern CP1 can be further enhanced.

By the way, an extending direction of each of the plurality of holes TH and the plurality of conductor patterns CP2 can be designed in any direction. For example, as shown in FIG. 6, the plurality of holes TH and the plurality of conductor patterns CP2 may be extended in the Y direction so that the width in the Y direction becomes wider than the width in the X direction. Further, as shown in FIG. 7, they may be extended in the X direction so that the width in the X direction becomes wider than the width in the Y direction. In a case of applying a structure of FIG. 7, after the dicing step, each part of the plurality of the conductor patterns CP2 is left as the plurality of conductor pattern pieces CP2a in the scribing region SR. Consequently, similarly to a structure of FIG. 6, the conductor pattern piece CP3a can be prevented from being flown off.

FIG. 8 shows the semiconductor device (semiconductor chip) 100 that has been acquired after the dicing step. The semiconductor substrate SUB of the semiconductor device 100 has a chip region CR for forming a transistor(s), and a scribing region SR surrounding the chip region CR. FIG. 9 shows, in the chip region CH, a region (cell region) 2A in which a main transistor (s) is formed, and a region (gate drawing region) 1A for drawing a gate electrode GE of the transistor. In the first embodiment, exemplified as such a transistor is a GG type IGBT (Insulated Gate Bipolar Transistor). As shown in FIG. 8, most of the semiconductor device 100 are covered with an emitter wiring EW, and a gate wiring GW is formed in an outer periphery of the emitter wiring EW. Although not illustrated in the figure, the emitter wiring EW and the gate wiring GW are covered with the protective film PIQ. A part of the protective film PIQ is provided with an opening, and the emitter wiring EW and the gate wiring GW that are exposed from the opening become an emitter pad and a gate pad. Since an external connecting terminal such as a wire ponding or clip (copper plate) is connected on the emitter pad and the gate pad, the semiconductor device 100 is electrically connected to another chip or wiring substrate.

As shown in FIG. 9, a drift region ND, which is an impurity region with low concentration, is formed on the semiconductor substrate SUB. Formed on a back-surface side of the semiconductor substrate SUB are an n-type field stop region NS having an impurity concentration higher than that of the drift region ND, a p-type collector region PC, and a collector electrode CE made of a metal film. That is, during the operation of the IGBT, a collector potential is applied to the collector region PC via the collector electrode CE.

A trench TR is formed on a front-surface side of the semiconductor substrate SUB. Further, a gate insulating film GF is formed on the semiconductor substrate SUB. The gate insulating film GF is a film on the same layer as that of the insulating film GF in the scribing region SR, and is made of the same material and has the same thickness as those of the insulating film GF.

A gate electrode GE is formed on the gate insulating film GF. The gate electrode GF is a film on the same layer as that of the conductor pattern CP1 in the scribing region SR, and is made of the same material and has the same thickness as those the conductor pattern CP1. Further, the gate electrode GE has an embedded electrode portion GEa embedded in the trench TR via the gate insulating film GF, and a drawing portion GEb located on the semiconductor substrate SUB via the gate insulating film GF.

A p-type floating region PF is formed on the semiconductor substrate SUB, and a p-type base region PB having a higher impurity concentration than the floating region PF is formed on the front surface of the floating region PF. The floating region PF is formed up to a position deeper than a bottom of the trench TR.

A hole barrier region NHB having an impurity concentration higher than that of the drift region ND is formed on the semiconductor substrate SUB between the two trenches TR, and a p-type base region PB is formed on a front surface of the hole barrier region NHB. Formed in the base region PB between the two trenches TR is an n-type emitter region NE having a higher impurity concentration than the hole barrier region NHB.

An insulating film IL is formed on the emitter region NE and the base region PB. The insulating film IL covers the conductor pattern CP1 in the scribing region and the gate insulating film GE in the chip region CR. Then, formed in the insulating film are a via-hole VH1 located on the gate electrode GE and a via-hole VH2 that penetrates the emitter region NE and reaches the base region PB. Incidentally, in the first embodiment, the via-hole VH1 is located on the drawing portion GEb.

Formed around a bottom of the via-hole VH2 is a p-type body region PR having a higher impurity concentration than the base region PB. The body region PR is provided to reduce contact resistance with an emitter wiring EW embedded in the via-hole VH2 and to prevent latch-up.

Formed in the via-hole VH1 is a via VIA1 connected to the gate electrode GE (drawing portion GEb). Formed in the via-hole VH2 are a via VIA2 connected to the emitter region NE, the base region PB, and the body region PR. The via VIA1 and the via VIA2 are films on the same layer as that of the conductor pattern CP2 in the scribing region SR, and are made of the same material and have the same thickness as those of the conductor pattern CP2.

A gate wiring GW connected to the via VIA1 is formed on the insulating film IL and the via VIA1. The emitter wiring EW connected to the via VIA2 is formed on the insulating film IL and the via VIA2. The gate wiring GW and the emitter wiring EW are films on the same layer as that of the conductor pattern CP3 and are made of the same material and have the same thickness as those of the conductor pattern CP3. During the operation of the IGBT, a gate potential is applied to the gate electrode GE via the gate wiring GW, and an emitter potential is applied to the emitter region EW, the base region PB, and the body region PR via the emitter wiring EW.

A protective film PIQ is formed on the gate wiring GW and the emitter wiring EW. The protective film PIQ is formed in the chip region CR and is not formed in the scribing region SR.

As described above, the semiconductor device 100 includes the IGBT formed in the chip region CR, and the conductor patterns CP1 to CP3 (conductor pattern pieces CP1*a* to CP3*a*) that are formed in the scribing region SR. Further, since the semiconductor pattern pieces CP1*a* to CP3*a* can be formed in the same step as the step of forming the gate electrode GE, the vias VIA1, VIA2, the gate wiring GW, and the emitter wiring EW that constitute the IGBT, the number of manufacturing steps for the conductor pattern pieces CP1*a* to CP3*a* is not increased.

<Method of Manufacturing Semiconductor Device>

Hereinafter, a method of manufacturing a semiconductor device according to the first embodiment will be described with reference to FIGS. 10 to 23. FIGS. 10 to 16 show states corresponding to a state of FIG. 9, and FIGS. 17 to 23 show states corresponding to states of FIGS. 3 and 4.

First, a semiconductor substrate SUB having a plurality of chip regions CR and a scribing region SR provided between the chip regions CR is prepared.

Figure 10:
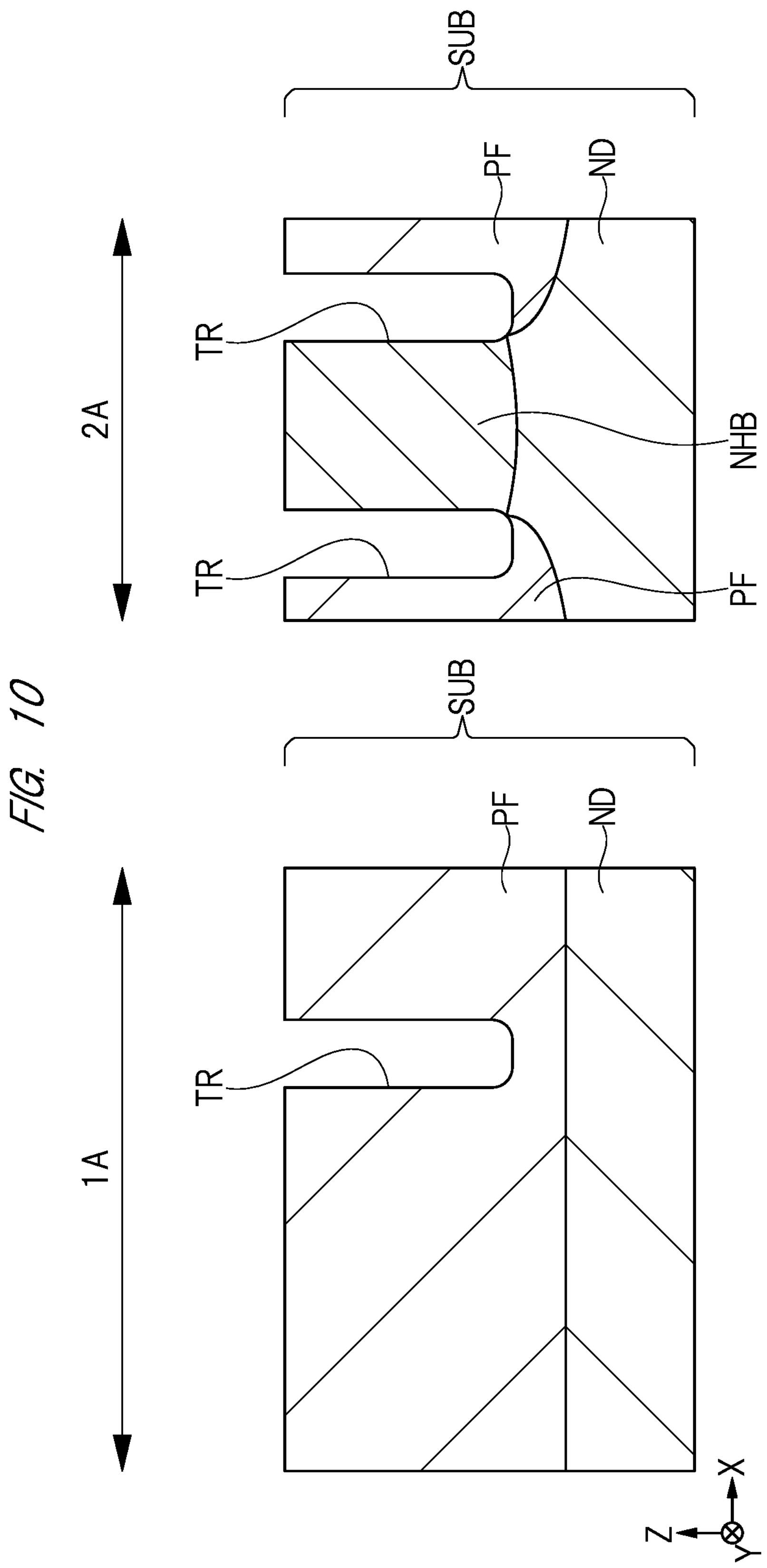
FIG. 10 is a sectional view showing a manufacturing process of the chip region of the semiconductor device in the first embodiment.
Figure 17:
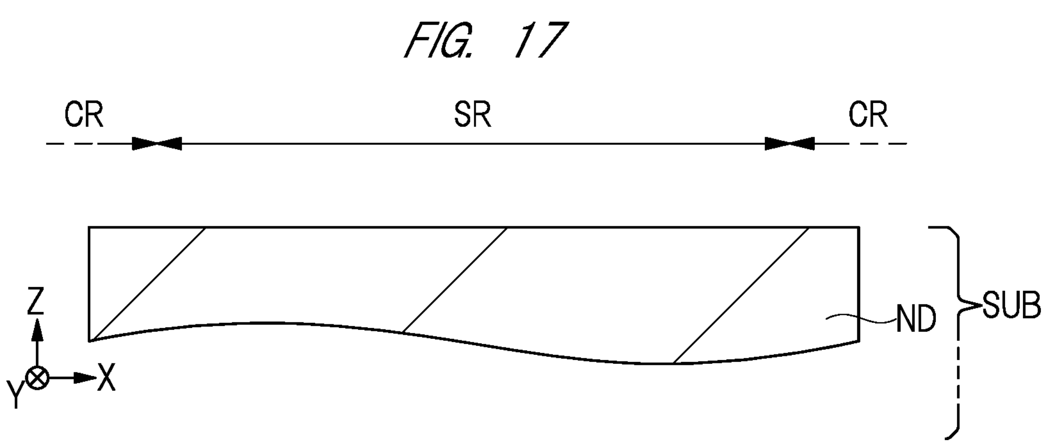
FIG. 17 is a sectional view showing a manufacturing process of the scribing region of the semiconductor device in the first embodiment.

Next, as shown in FIGS. 10 and 17, a drift region ND is formed on the semiconductor substrate SUB. For the drift region ND, a semiconductor substrate SUB into which n-type impurities have been introduced is prepared in advance, and the n-type semiconductor substrate SUB can be used as the drift region ND. Alternatively, a p-type semiconductor substrate SUB is prepared, and a drift region ND may be formed on the P-type semiconductor substrate SUB by an epitaxial method.

Next, a hole barrier region NHB is formed on the semiconductor substrate SUB of the region 2A by using a photolithography method and an ion implantation method, and a floating region PF is formed on the semiconductor substrate SUB of the region 1A and the region 2A.

Next, an insulating film made of, for example, a silicon oxide film is formed on the semiconductor substrate of the region 1A and the region 2A, and the insulating film is patterned by a photolithography method and a dry etching to forma hard mask. Next, by etching the semiconductor substrate SUB using this hard mask as a mask, a plurality of trenches TR are formed in the semiconductor substrate SUB. Then, the hard mask is removed.

Next, by performing a heat treatment to the semiconductor substrate SUB, impurities contained in the hole barrier region NHB and the floating region PF are diffused. By this heat treatment, the hole barrier region NHB is diffused to the vicinity of a bottom of each of the plurality of trenches TR, and the floating region PF is diffused up to a position deeper than the bottom of each of the plurality of trenches TR so as to cover the bottom of each of the plurality of trenches TR.

Figure 11:
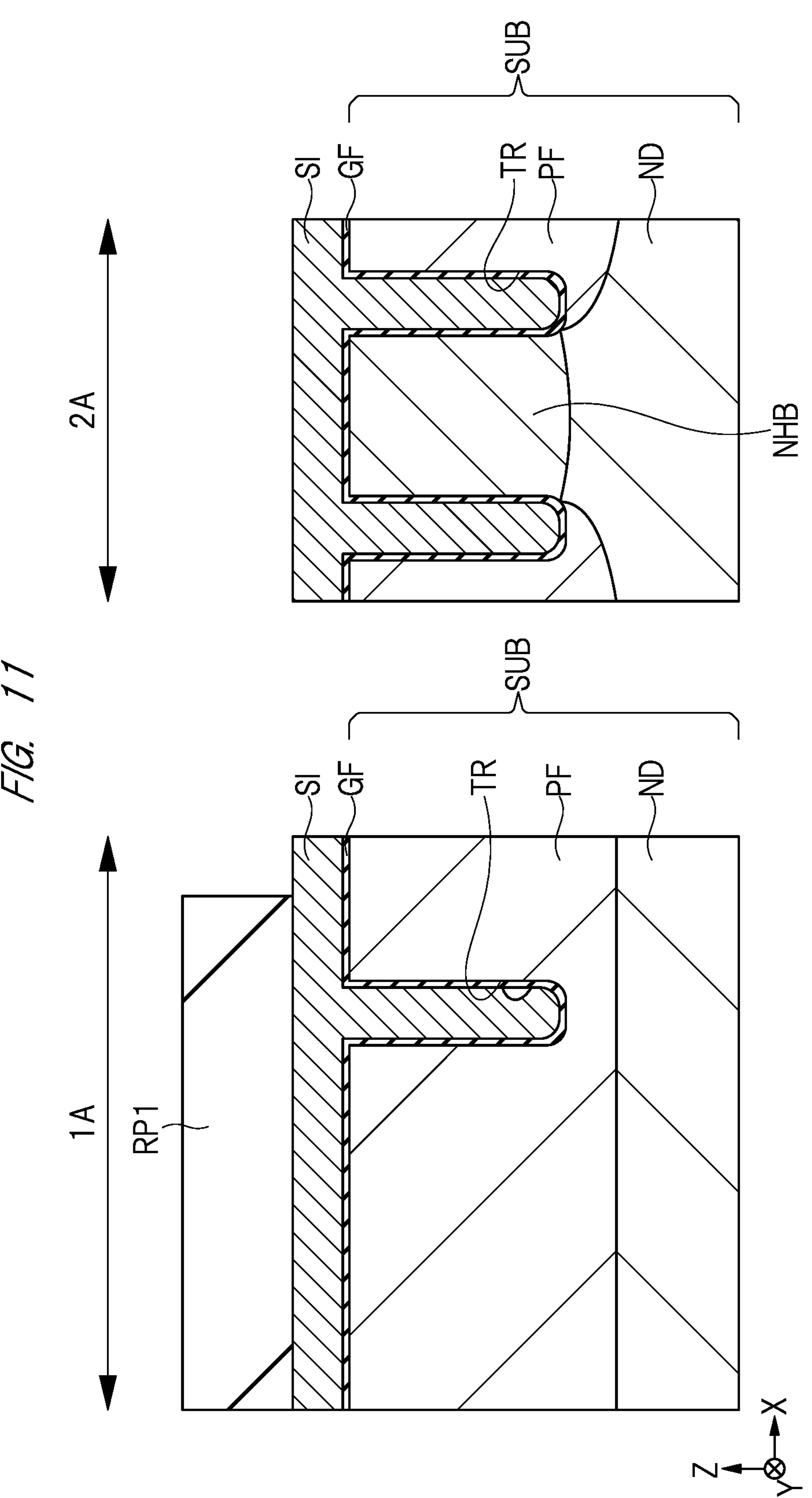
FIG. 11 is a sectional view showing the manufacturing process following FIG. 10.
Figure 18:
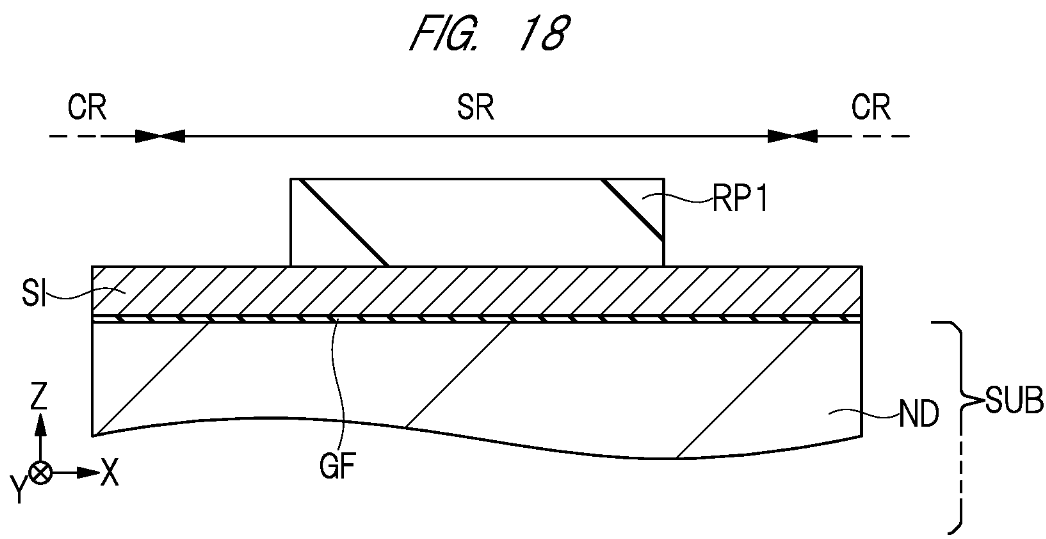
FIG. 18 is a sectional view showing the manufacturing process following FIG. 17.

Next, as shown in FIGS. 11 and 18, by performing a thermal oxidation treatment to the semiconductor substrate SUB, an insulating film GF is formed in the trench TR of the region 1A and region 2A, on the semiconductor substrate SUB, and on the semiconductor substrate SUB in the scribing region SR. The insulating film GF of the region 1A and the region 2A functions as a gate insulating film GF.

Next, a polycrystalline silicon film SI is formed as a conductor film on the insulating film GF by, for example, a CVD (Chemical Vapor Deposition) method so as to embed an inside of the trench TR. Next, a resist pattern RP1 is formed on the polycrystalline silicon film SI. The resist pattern RP1 has a pattern that covers a part of the polycrystalline silicon film SI in the region 1A and the scribing region SR and opens the polycrystalline silicon film SI in the region 2A.

Figure 12:
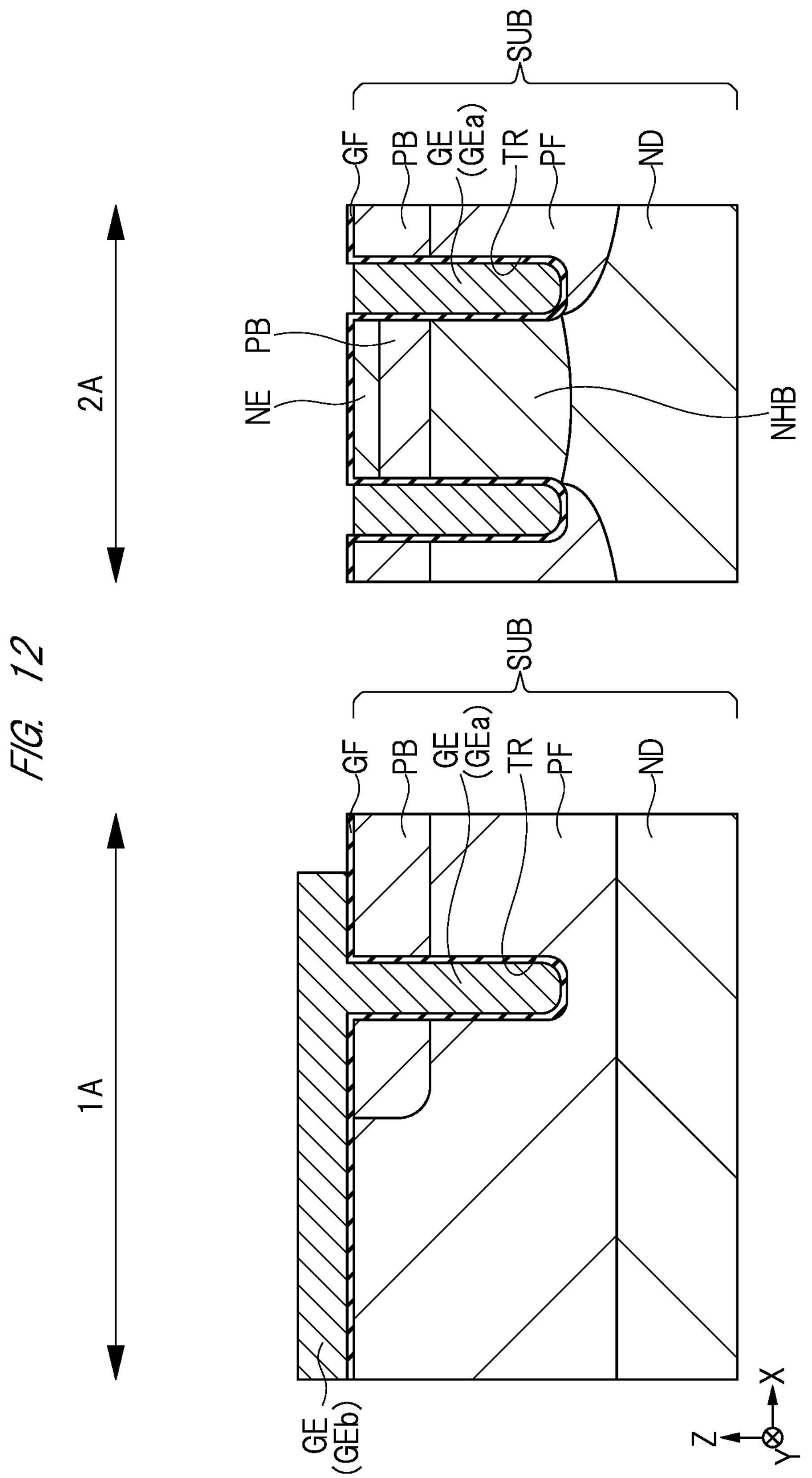
FIG. 12 is a sectional view showing the manufacturing process following FIG. 11.
Figure 19:
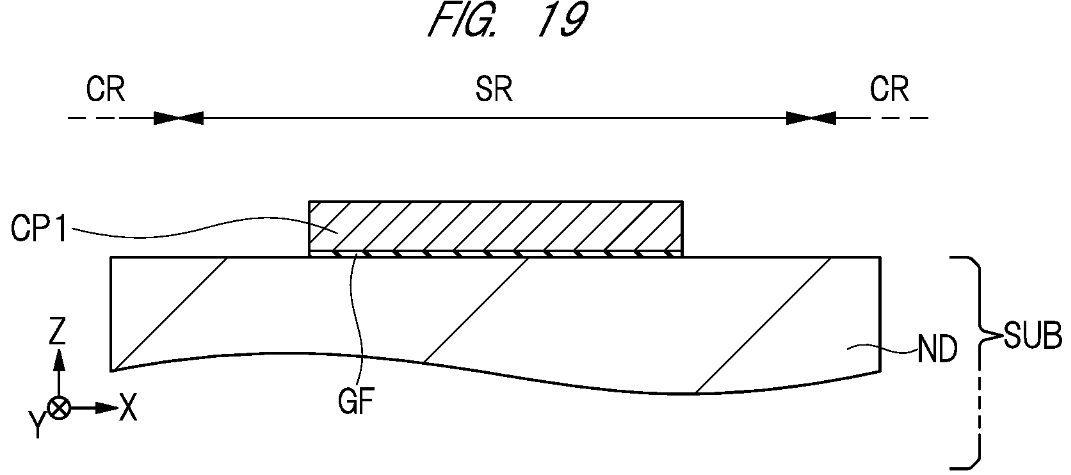
FIG. 19 is a sectional view showing the manufacturing process following FIG. 18.

Next, as shown in FIGS. 12 and 19, the polycrystalline silicon film SI is subjected to a dry etching processing using the resist pattern PR1 as a mask, and the polysilicon silicon film SI is selectively patterned. Consequently, formed in the chip region CR is a gate electrode GE having an embedded electrode portion GEa embedded in the trench TR and a drawing portion GEb located on the semiconductor substrate SUB and connected to the embedded electrode portion GEa. Further, in the above-mentioned scribing region, a conductor pattern CP1 is formed on the semiconductor substrate SUB.

Next, by using the photolithography method and the ion implantation method, a base region PB is formed on each front surface of the floating region PF and the hole barrier region NHB, and an n-type emitter region NE is formed on a front surface of the base region PB.

Figure 13:
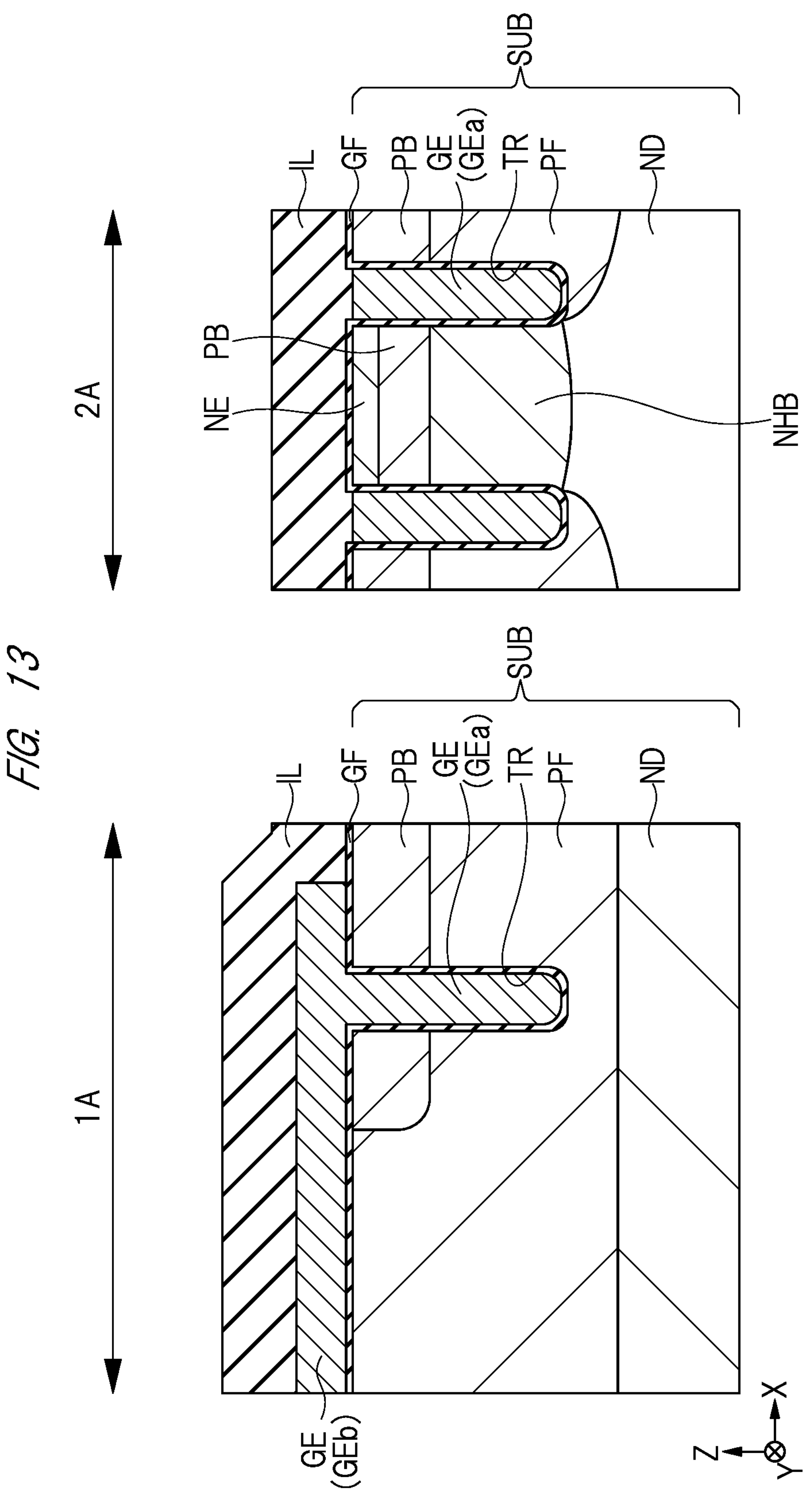
FIG. 13 is a sectional view showing the manufacturing process following FIG. 12.
Figure 20:
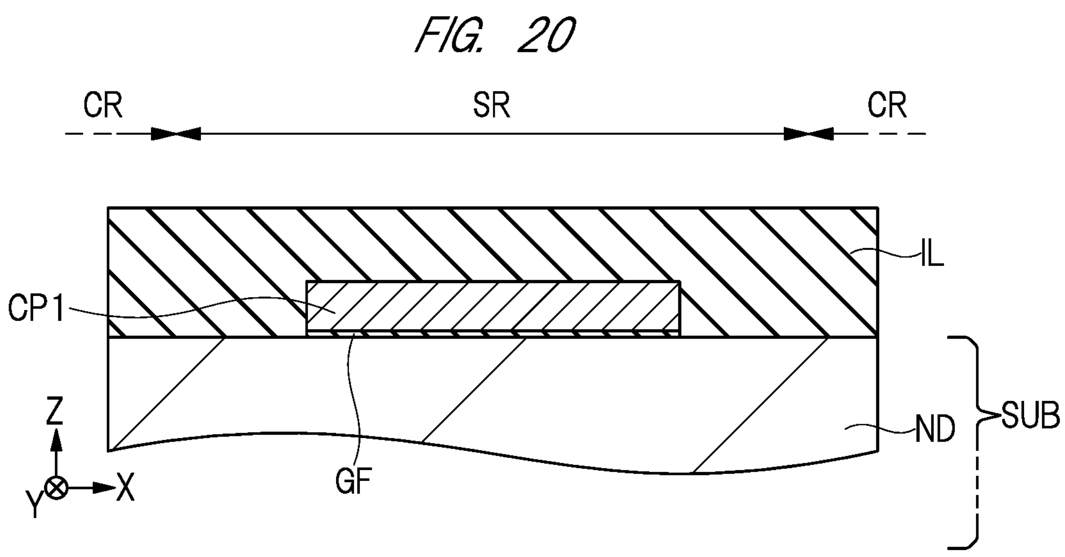
FIG. 20 is a sectional view showing the manufacturing process following FIG. 19.

Next, as shown in FIGS. 13 and 20, an insulating film IL is formed on the semiconductor substrate SUB so as to cover the gate electrode GE in the region 1A and region 2A and cover the conductor pattern CP1 in the scribing region SR, for example, by the CVD method.

Figure 14:
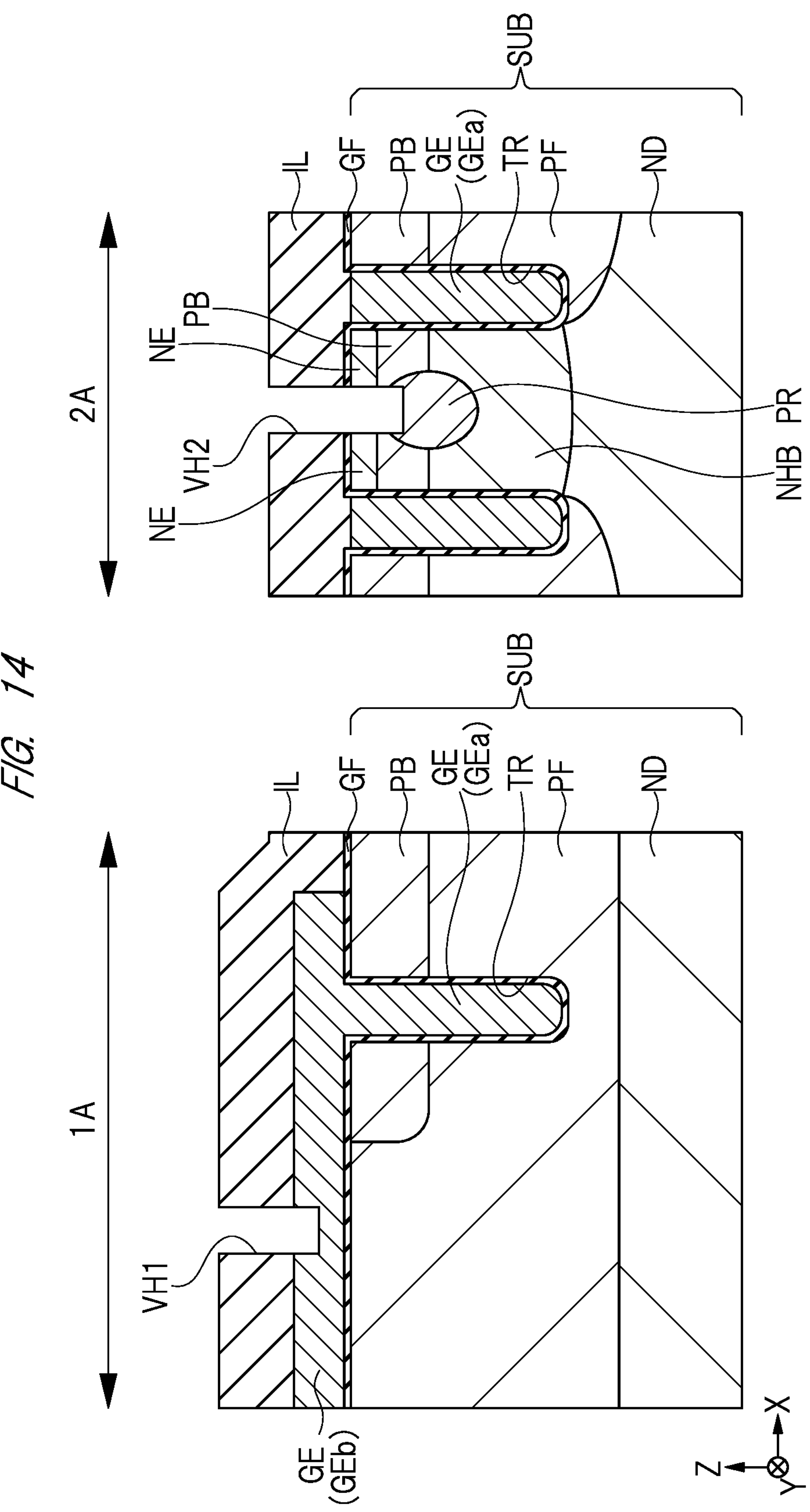
FIG. 14 is a sectional view showing the manufacturing process following FIG. 13.
Figure 21:
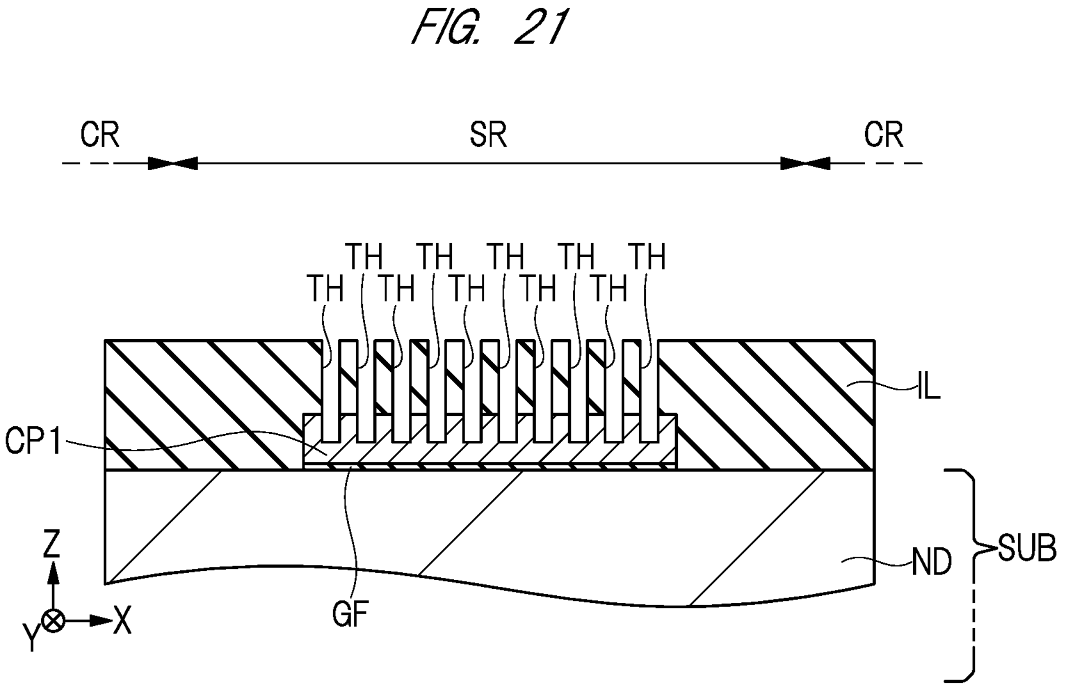
FIG. 21 is a sectional view showing the manufacturing process following FIG. 20.

Next, as shown in FIGS. 14 and 21, by using the photolithography method and the dry etching processing, a via-hole VH1 is formed in the insulating film IL so as to be located on the drawing portion GEb in the region 1A; a via-hole VH2 is formed in the insulating film IL so as to reach the emitter region NE and the base region PB in the region 2A; and a plurality of holes TH are formed in the insulating film IL so as to be located on the conductor pattern CP1 in the scribing region SR. Here, the via-hole VH1, the via-hole VH2, and the plurality of holes TH can be formed by the same step, but may be formed by different steps from one another.

Next, a body region PR is formed at the bottom of the via-hole VH2 by using the ion implantation method. Thereafter, a heat treatment is performed to activate each impurity region.

Figure 15:
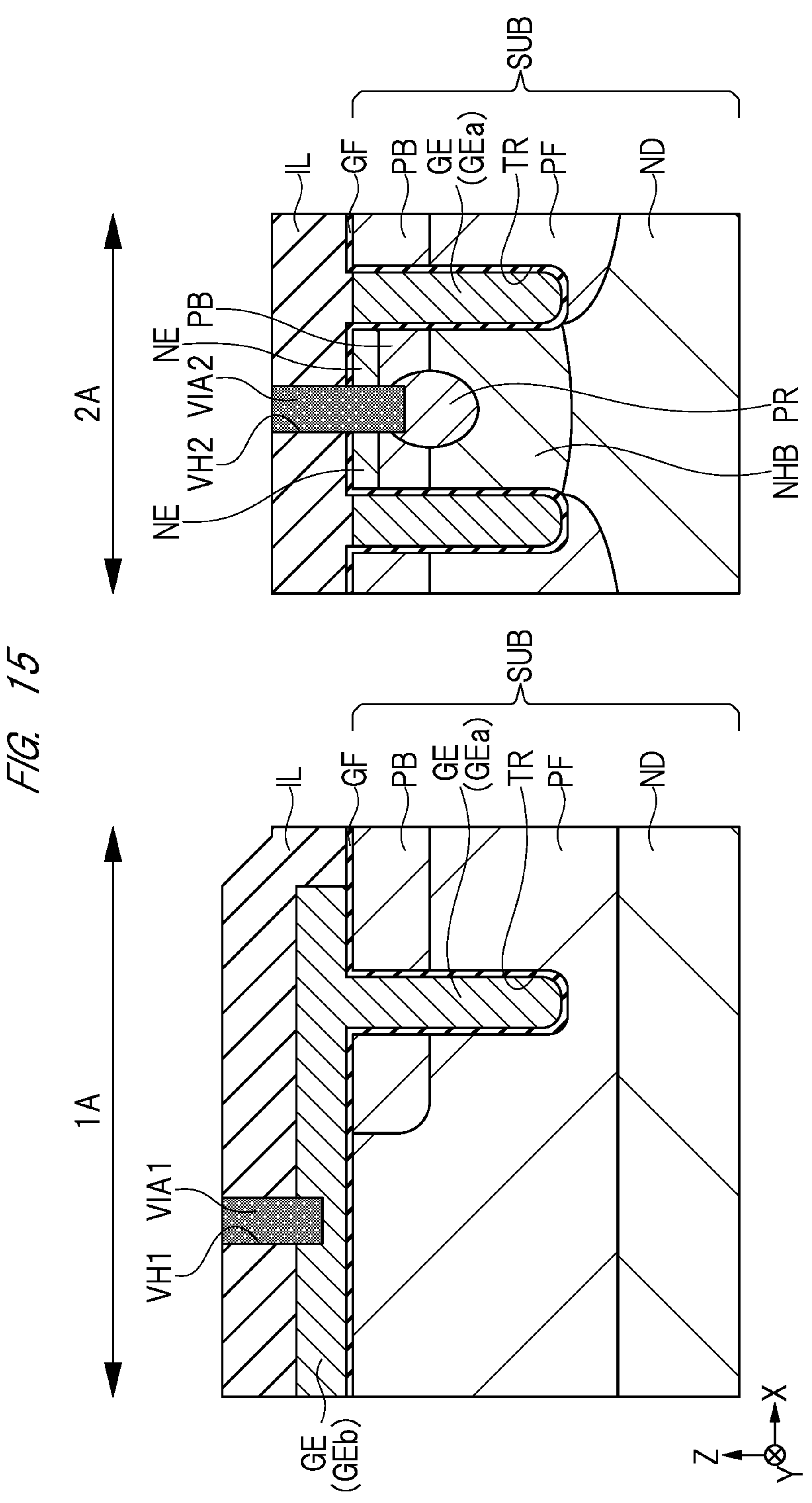
FIG. 15 is a sectional view showing the manufacturing process following FIG. 14.
Figure 22:
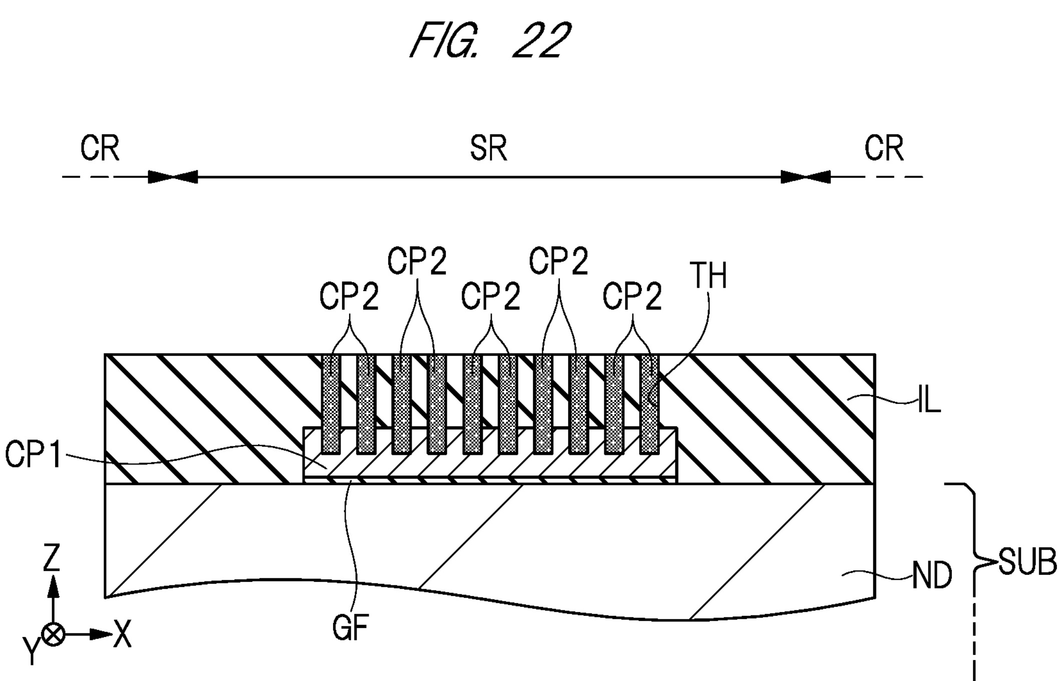
FIG. 22 is a sectional view showing the manufacturing process following FIG. 21.

Next, as shown in FIGS. 15 and 22, barrier metal films such as a titanium film and a titanium nitride film and a conductor film such as a tungsten film are formed in the via-hole VH1, in the via-hole VH2, in the plurality of holes TH, and on the insulating film IL by, for example, a sputtering method or a CVD method. Next, the above-mentioned barrier metal film and conductor film outside the via-hole VH1, outside the via-hole VH2, and outside the plurality of holes TH are removed by a dry etching processing or a CMP (Chemical Mechanical Polishing) method. Consequently, the via VA1, the via VA2, and the plurality of conductor patterns CP2 are formed in the via-hole VH1, the via-hole VH2, and the plurality of holes TH.

Figure 16:
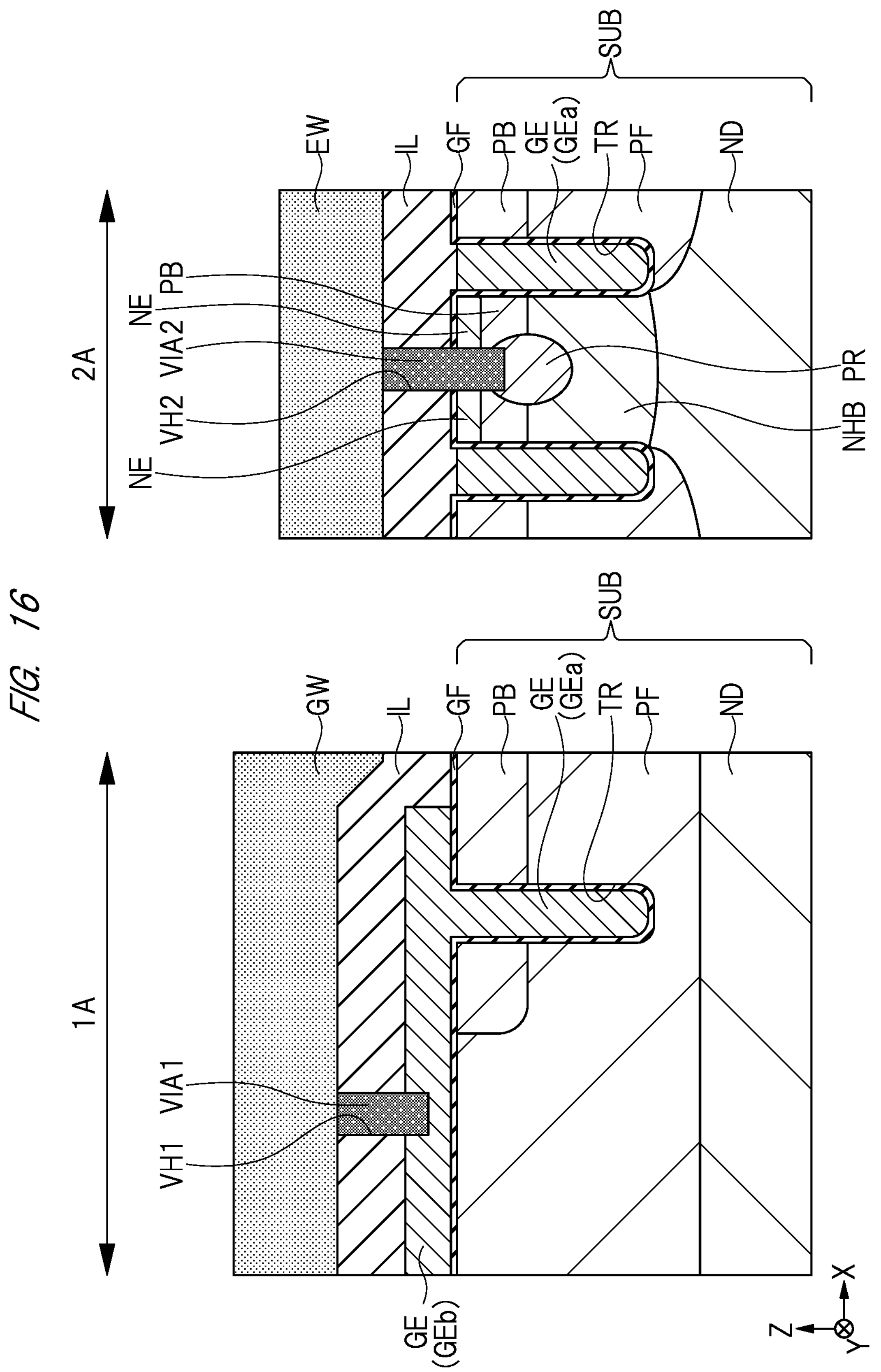
FIG. 16 is a sectional view showing the manufacturing process following FIG. 15.
Figure 23:
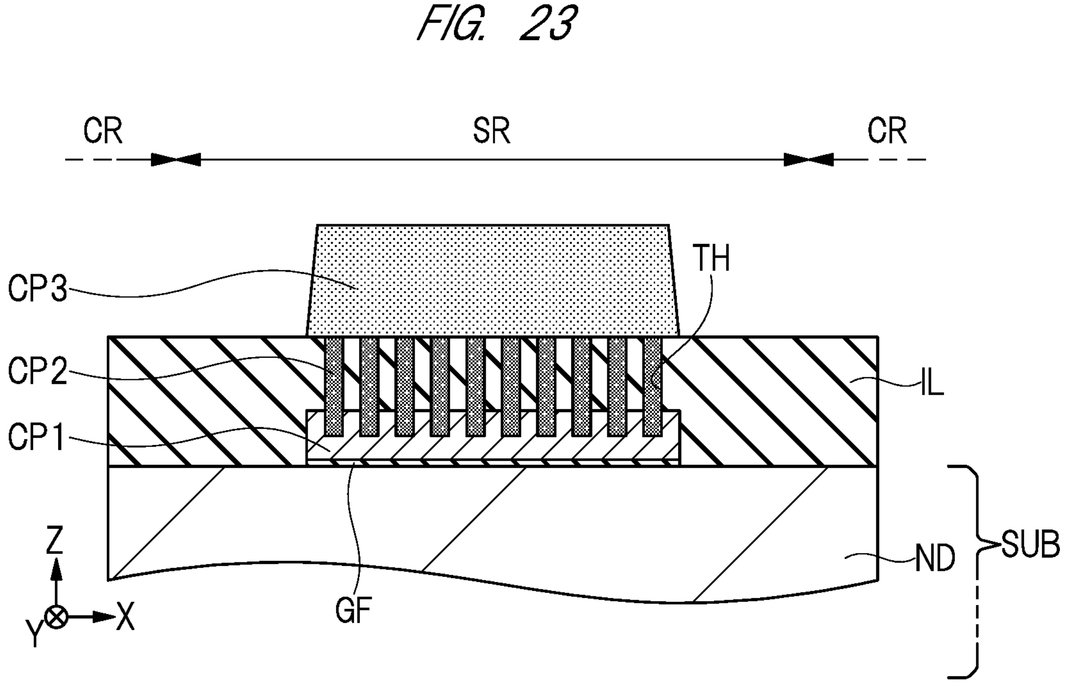
FIG. 23 is a sectional view showing the manufacturing process following FIG. 22.

Next, as shown in FIGS. 16 and 23, a barrier metal film such as tungsten titanium film, a titanium nitride film, or a titanium tungsten film and a conductor film such as an aluminum film or an aluminum alloy film are formed on the via VIA1, the via VIA2, on the plurality of conductor patterns CP2, and on the insulating film IL by, for example, a sputtering method. Next, the above-mentioned conductor film and barrier metal film on the insulating film IL are patterned by using a photolithography method and a dry etching process. Consequently, a gate wiring GW is formed on the via VIA1 and the insulating film IL in the region 1A; an emitter wiring EW is formed on the via VIA2 and the insulating film IL in the region 2A; and a conductor patterns CP3 is formed on the plurality of conductor pattern CP2 and the insulating film IL in the scribing region SR.

Next, as shown in FIGS. 9 and 3, a protective film PIQ is formed so as to cover the gate wiring GE, the emitter wiring EW, and the conductor pattern CP3 by, for example, a coating method. Thereafter, by selectively patterning the protective film PIQ using a photolithography method and a dry etching processing, a part of the gate wiring GW, a part of the emitter wiring EW, and the conductor pattern CP3 are exposed.

Next, by performing a polishing processing to a back surface of the semiconductor substrate SUB, a thickness of the semiconductor substrate SUB is reduced (thinned). Next, a field stop region NS and a p-type collector region PC are formed on the back surface of the semiconductor substrate SUB by a photolithography method and an ion implantation method. Next, a collector electrode CE having a multilayer metal film such as an aluminum film, a titanium film, a nickel film, a gold film, or a silver film is formed on the front surface of the collector region PC exposed on the back-surface side of the semiconductor substrate SUB by, for example, a sputtering method.

Thereafter, as shown in FIG. 4, by cutting off the scribing region SR with the dicing blade DC, the semiconductor substrate SUB is individuated and a plurality of semiconductor devices 100 are acquired.

Application Example 1 of Conductor Patterns CP1 to CP3

Hereinafter, a case where a conductor pattern CP1, a plurality of conductor patterns CP2 and a conductor pattern CP3 are used as measuring pads will be described with reference to FIGS. 24 to 27. An inspection terminal such as a probe terminal contacts with the conductor pattern CP3 of the measuring pad MP.

Provided in the scribing region SR are two sets or more of measuring pads MP. Here, two sets of measuring pads MP are shown as an example of two sets or more of measuring pads MP. A conductor pattern CP4, a plurality of conductor patterns CP5 connected to the conductor pattern CP4, and a conductor pattern CP6 connected to the plurality of conductor patterns CP5 are provided between the two sets of measuring pads MP.

The conductor pattern CP4 is formed on the same layer as that of the conductor pattern CP1, and is made of the same material and has the same thickness as those of the conductor pattern CP1. The plurality of conductor patterns CP5 are formed on the same layer as that of the plurality of conductor patterns CP2, and are made of the same material and have the same thickness as those of the plurality of conductor patterns CP2. The conductor pattern CP6 is formed on the same layer as that of the conductor pattern CP3, and is made of the same material and has the same thickness as those of the conductor pattern CP3.

The conductor pattern CP6 is provided as an inspection terminal and is electrically connected to at least one of the two sets of measuring pads.

Figure 24:
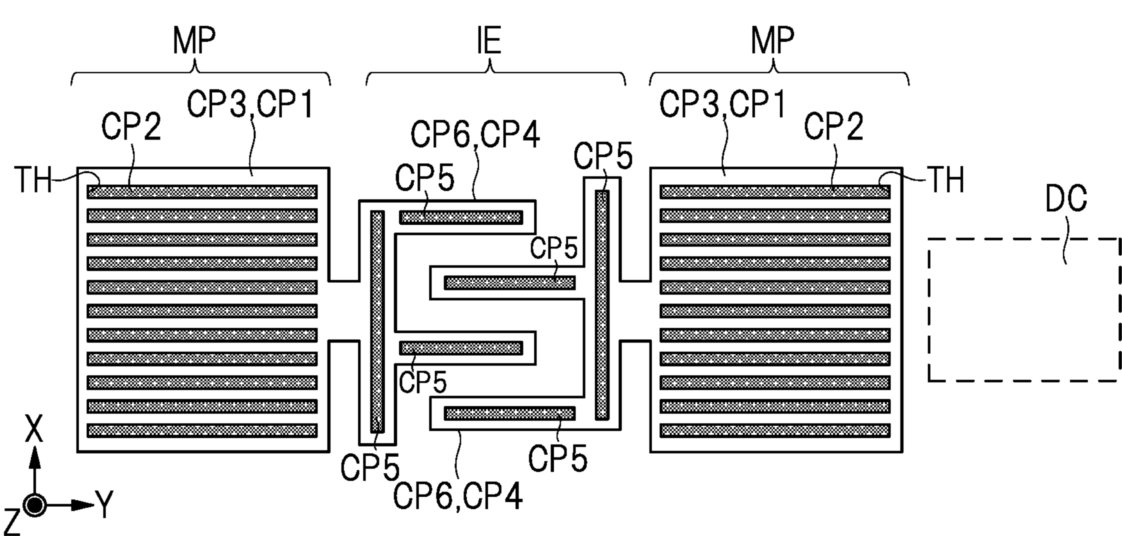
FIG. 24 is a plan drawing showing an example of applying, as measurement patterns, the conductor patterns of the first embodiment.

FIG. 24 shows an inspection terminal related to a short-circuit defect between wirings. The conductor pattern CP6 connected to one measuring pad MP and the conductor pattern CP6 connected to the other measuring pad MP are formed into a comb-like shape, and are arranged so that mutual comb teeth become alternate. By applying different voltages to one measuring pad MP and the other measuring pad MP, a breakdown voltage between the one conductor pattern CP6 and the other conductor pattern CP6 can be measured.

Figure 25:
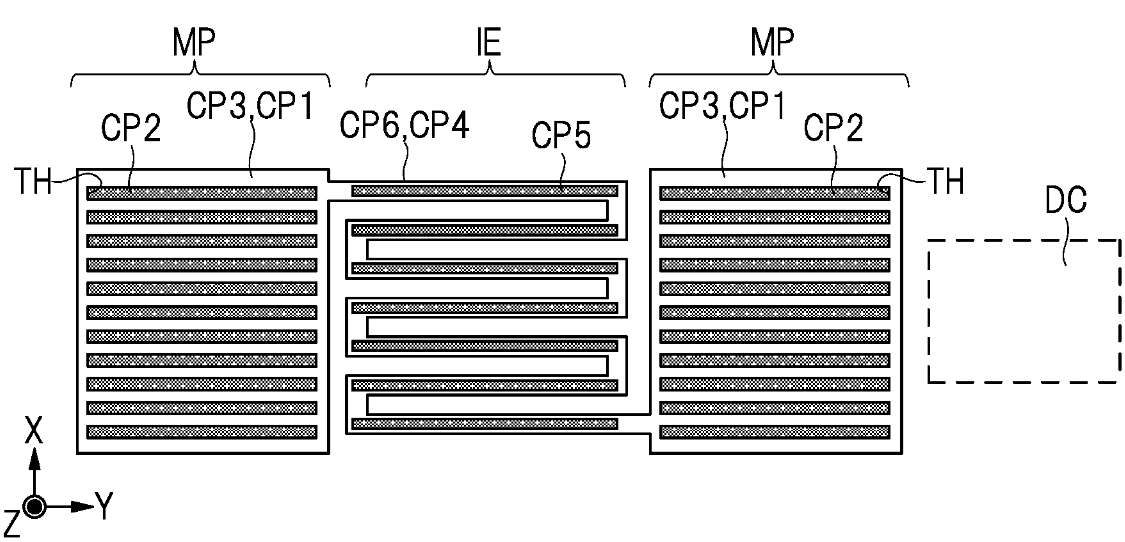
FIG. 25 is a plan drawing showing an example of applying, as measurement patterns, the conductor patterns of the first embodiment.

FIG. 25 shows an inspection element related to wiring resistance. The conductor pattern CP6 repeated a plurality of times is connected to the two sets of measuring pads MP. This makes it possible to measure the resistance between the two sets of measuring pads MP.

Figure 26:
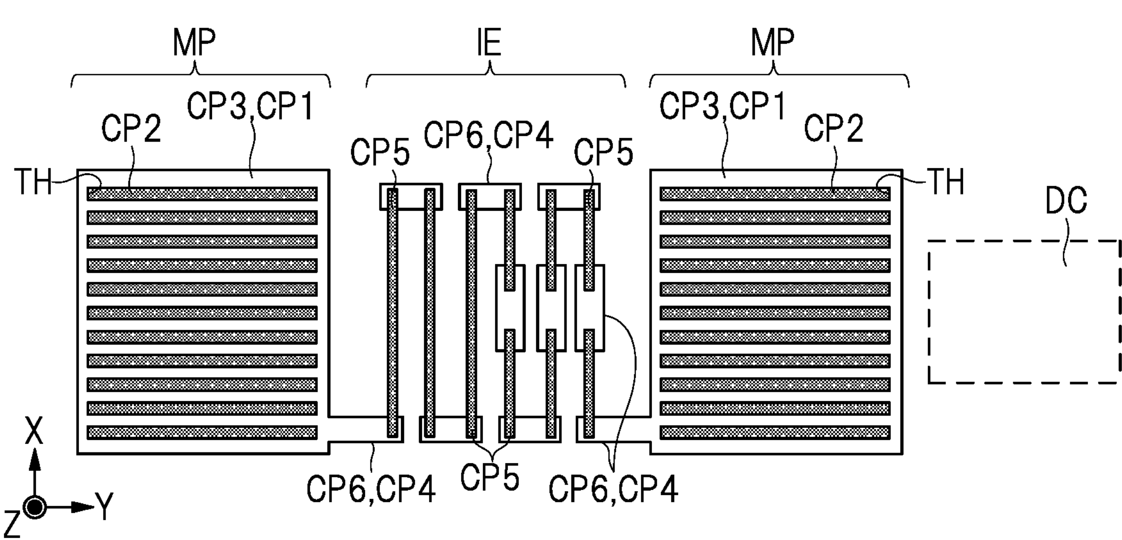
FIG. 26 is a plan drawing showing an example of applying, as measurement patterns, the conductor patterns of the first embodiment.
Figure 27:
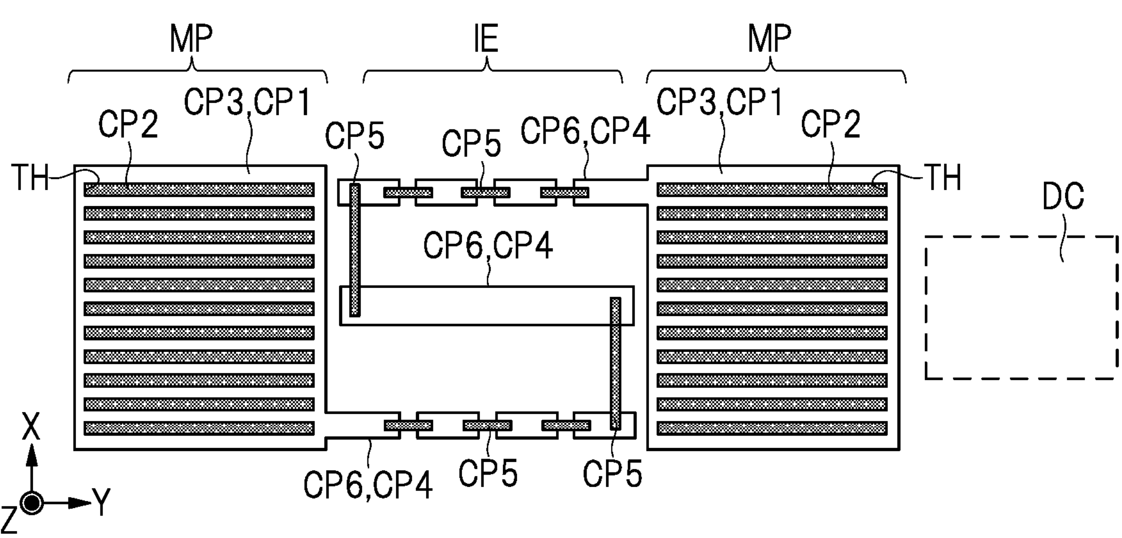
FIG. 27 is a plan drawing showing an example of applying, as measurement patterns, the conductor patterns of the first embodiment.

FIGS. 26 and 27 show an inspection element called a so-called chain resistor. By preparing a plurality of conductor patterns CP6 and appropriately combining and connecting these by the plurality of conductor patterns CP5, various wiring resistance patterns can be formed.

In any of the inspection terminals, a part of the conductor pattern CP4, all or part of at least one conductor pattern CP5 of the plurality of conductor patterns CP5, and a part of the conductor pattern CP6 are left in the scribing region SR after the dicing step.

After the dicing step, the conductor patterns CP4 to CP6 are removed by the dicing blade DC. However, the part of the conductor pattern CP6 is left in the scribing region SR. By making sure that the remaining conductor pattern CP6 is connected to the conductor putters CP4, CP5, a part of the remaining inspection terminal can be prevented from being peeled off.

Application Example 2 of Conductor Patterns CP1 to CP3

Figure 28:
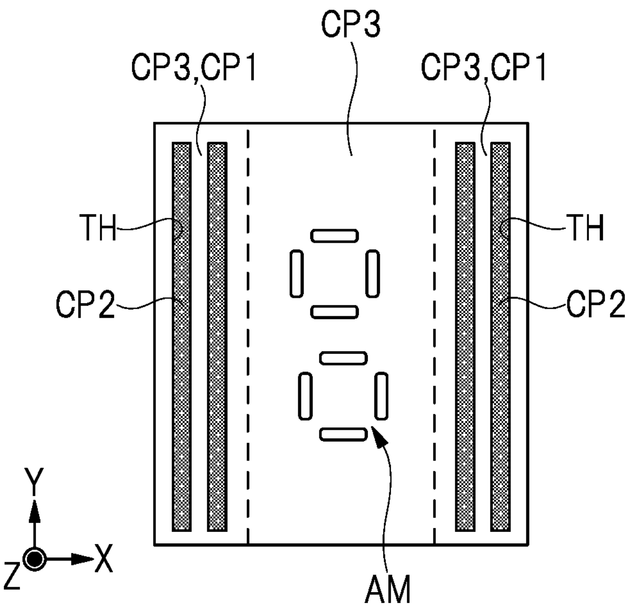
FIG. 28 is a plan drawing showing an example of applying, as alignment marks, the conductor patterns of the first embodiment.

Hereinafter, a case where the conductor pattern CP1, the plurality of conductor patterns CP2, and the conductor pattern CP3 are used as alignment patterns will be described with reference to FIG. 28. As shown in FIG. 28, the conductor pattern CP3 is provided with an alignment mark AM. The alignment mark AM is formed as an opening in which a part of the conductor pattern CP3 is opened.

In order to facilitate detection of such an alignment mark AM, it is preferable that the other conductor is not formed in a lower portion of the alignment mark AM. Therefore, the conductor pattern CP1, the plurality of holes TH, and the plurality of conductor patterns CP2 are provided at such positions as not to overlap with the alignment mark AM in a plan view. Then, these are provided at such positions as to be connected to the conductor pattern CP3 left in the scribing region SR after the dicing step. Therefore, even if the alignment mark AM is removed after the dicing step, the conductor pattern CP3 can be prevented from being peeled off.

Second Embodiment

Figure 29:
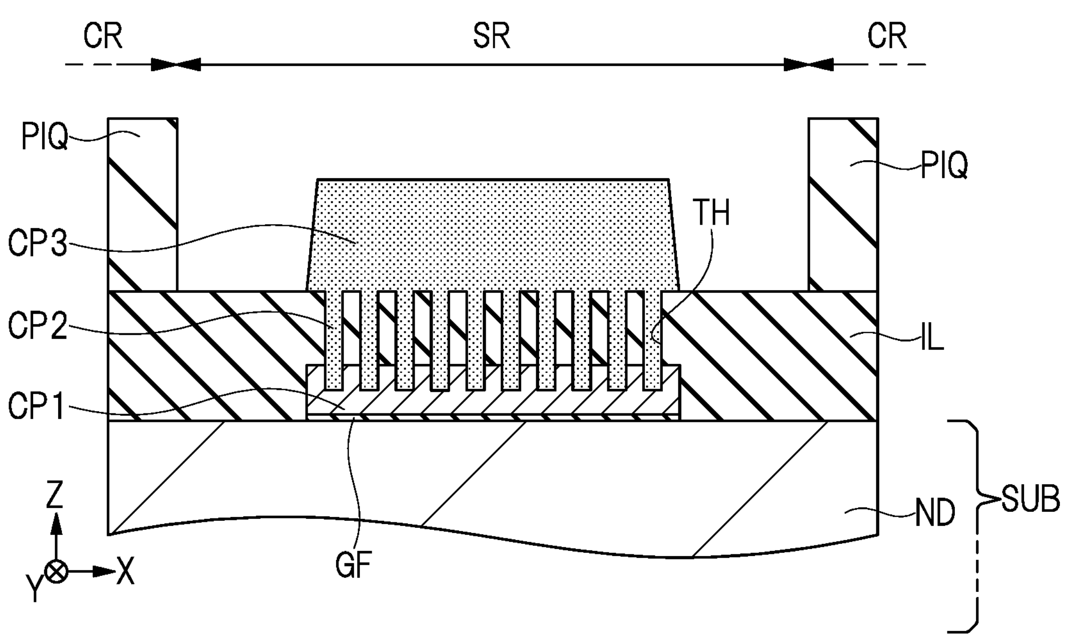
FIG. 29 is a sectional view showing a scribing region in a second embodiment.

Hereinafter, a semiconductor device 100 according to a second embodiment will be described with reference to FIGS. 29 to 31. Incidentally, in the following description, a difference from the first embodiment will be mainly described, and a point overlapping with the first embodiment will be omitted.

In the first embodiment, a step of forming the conductor pattern CP2 and a step of forming the conductor pattern CP3 are performed as separate steps. In the second embodiment, these steps are performed as the same step.

A manufacturing process of the second embodiment is the same as that of the first embodiment up to FIGS. 14 and 21. Next, the barrier metal film and the conductor film, which have been described with reference to FIGS. 16 and 23, are formed. That is, for example, by a sputtering method, a barrier metal film such as a tungsten titanium film, a titanium nitride film, or a titanium tungsten film, and a conductor film such as an aluminum film or an aluminum alloy film are formed in the via-hole VH1, in the via-hole VH2, in the plurality of holes TH, and on the insulating film IL. Next, the above-mentioned conductor film and barrier metal film on the insulating film IL are patterned by using a photolithography method and a dry etching processing.

Figure 31:
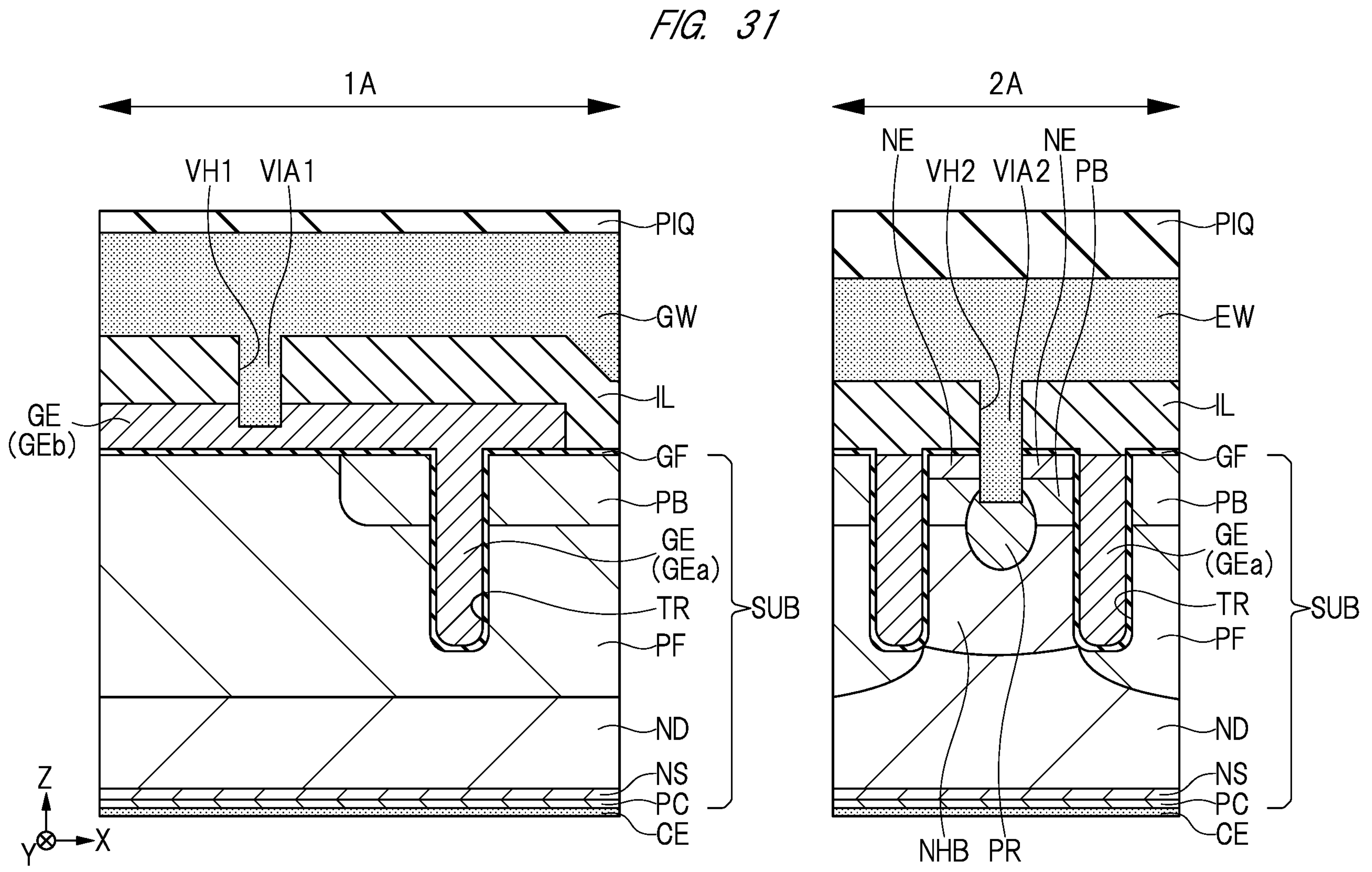
FIG. 31 is a sectional view showing a chip region in the second embodiment.

Consequently, as shown in FIG. 31, the via VIA1 in the via-hole VH1 and the gate wiring GW on the insulating film IL are integrally formed in the region 1A. Further, the via VIA2 of the via-hole VH2 and the emitter wiring EW on the insulating film IL are integrally formed in the region 2A. Furthermore, as shown in FIG. 29, the plurality of conductor patterns CP2 in the plurality of holes TH and the conductor pattern CP3 on the insulating film IL are integrally formed in the scribing region SR.

Figure 30:
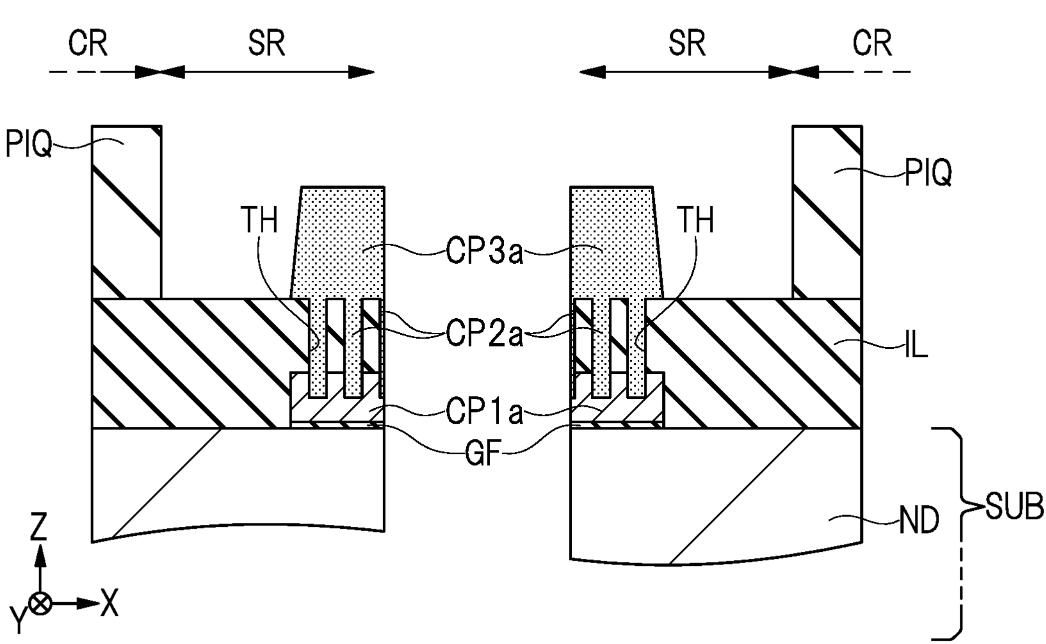
FIG. 30 is a sectional view showing a scribing region in the second embodiment.

After the dicing step, as shown in FIG. 30, a plurality of integrally formed conductor pattern pieces CP2*a*, CP3*a* are left in the scribing region SR. Also in the second embodiment, since the conductor pattern piece CP3*a* can be prevented from being flown off (scattered), it is possible to improve the reliability of the semiconductor device 100 and suppress the decrease in yield of the semiconductor device 100.

Further, as compared with the first embodiment, the second embodiment can omit a step of forming the plurality of conductor pattern CP2, so that simplification of a manufacturing process is achieved and the manufacturing cost can be reduced.

Third Embodiment

Figure 32:
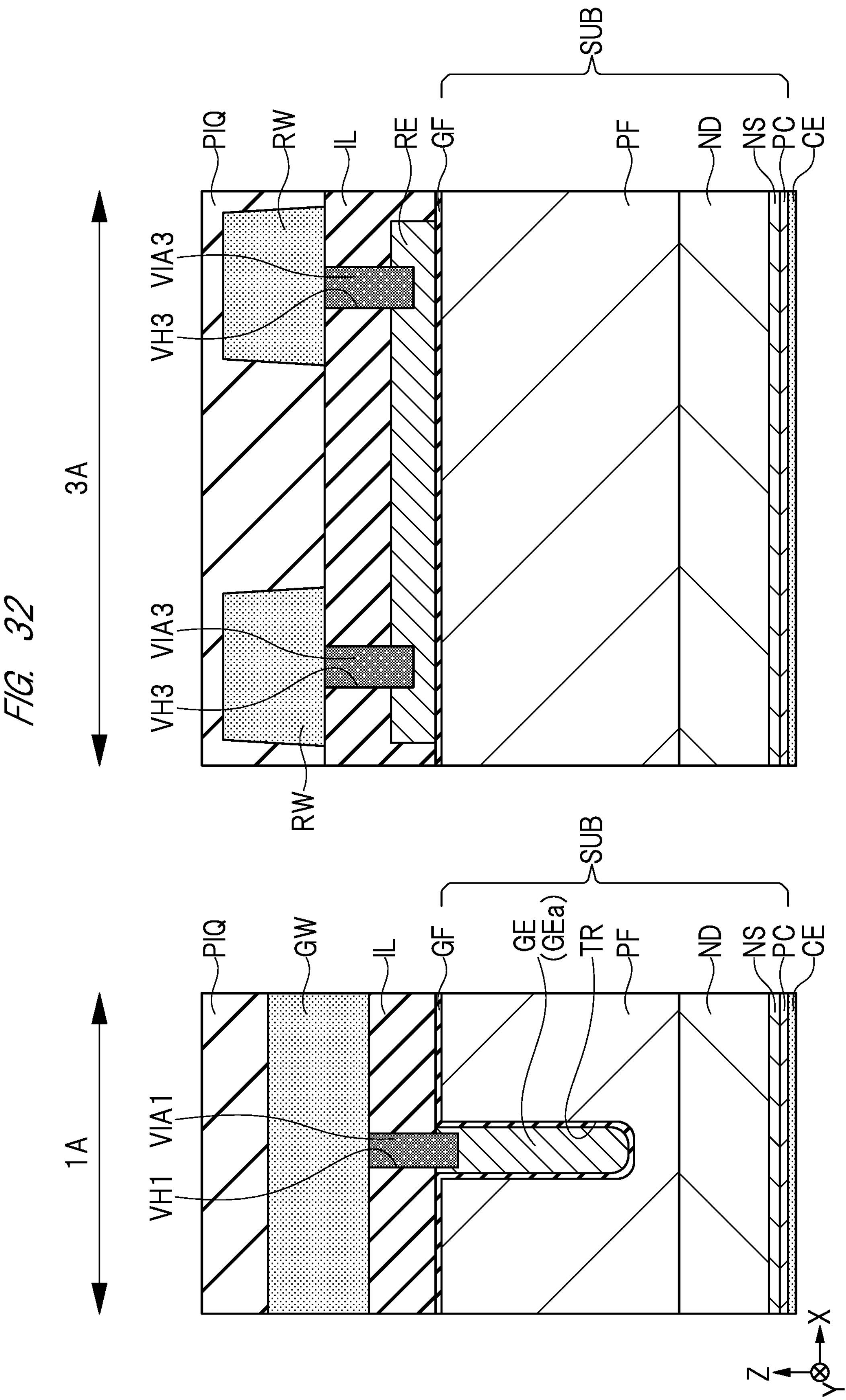
FIG. 32 is a sectional view showing a chip region in a third embodiment.

Hereinafter, a semiconductor device 100 according to a third embodiment will be described with reference to FIG. 32. Incidentally, in the following description, a difference from the first embodiment will be mainly described, and a point overlapping with the first embodiment will be omitted.

In the first embodiment, the gate electrode GE has been configured by the embedded electrode portion GEa embedded in the trench TR and the drawing portion GEb formed on the semiconductor substrate SUB. In the third embodiment, as shown in the region 1A of FIG. 32, the entire gate electrode GE is embedded in the trench TR via the gate insulating film GF. In other words, the entire gate electrode GE is formed as an embedded electrode portion GEa. Then, the via-hole VH1 is formed in the insulating film IL so as to be located on the gate electrode GE, and the via VIA1 is directly connected to the embedded gate electrode GE.

Further, the semiconductor substrate SUB of the third embodiment has a region (resistance element forming region) 3A for forming a resistance element RE at a position different from the region 1A and the region 2A. The resistance element RE is formed on the semiconductor substrate SUB of the region 3A via the gate insulating film GF and is separated from the gate electrode GE.

The resistance element RE is covered with the insulating film IL. The via-hole VH3 is formed in the insulating film IL so as to be located on the resistance element RE. The via VIA3 is formed in the via-hole VH3 and is connected to the resistance element RE. A resistance wiring connected to the via VIA 3 is formed on the via VIA3 and the insulating film IL.

In order to form such a resistance element RE, the resist pattern RP1 described with reference to FIG. 11 is not formed in the region 1A, but is formed so as to selectively cover the polycrystalline silicon film SI in the region 3A. under such a state, the dry etching processing described with reference to FIG. 12 is performed to selectively pattern the polycrystalline silicon film SI. Consequently, the gate electrode GE embedded in the trench TR can be formed in the region 1A and the region 2A, and the resistance element Re separated from the gate electrode GE can be formed in the region 3A.

Further, the via-hole VH3, the via VIA3, and the resistance wiring RW can be formed by the same step as the step of forming the via-hole VH1, the via VIA1, and the gate wiring GW. That is, the via VIA3 and the resistance wiring RE are films on the same layer as that of the via VIA1 and the gate wiring GW, and are made of the same material and have the same thickness as those of the via VIA1 and the gate wiring GW.

In this way, even in a form in which the entire gate wiring GW is embedded in the trench TR, the resistance element RE and the conductor pattern CP1 can be formed at the same time by using the resist pattern RP1.

Incidentally, a technique disclosed in the second embodiment can also be applied to a technique disclosed in the third embodiment.

Fourth Embodiment

Figure 33:
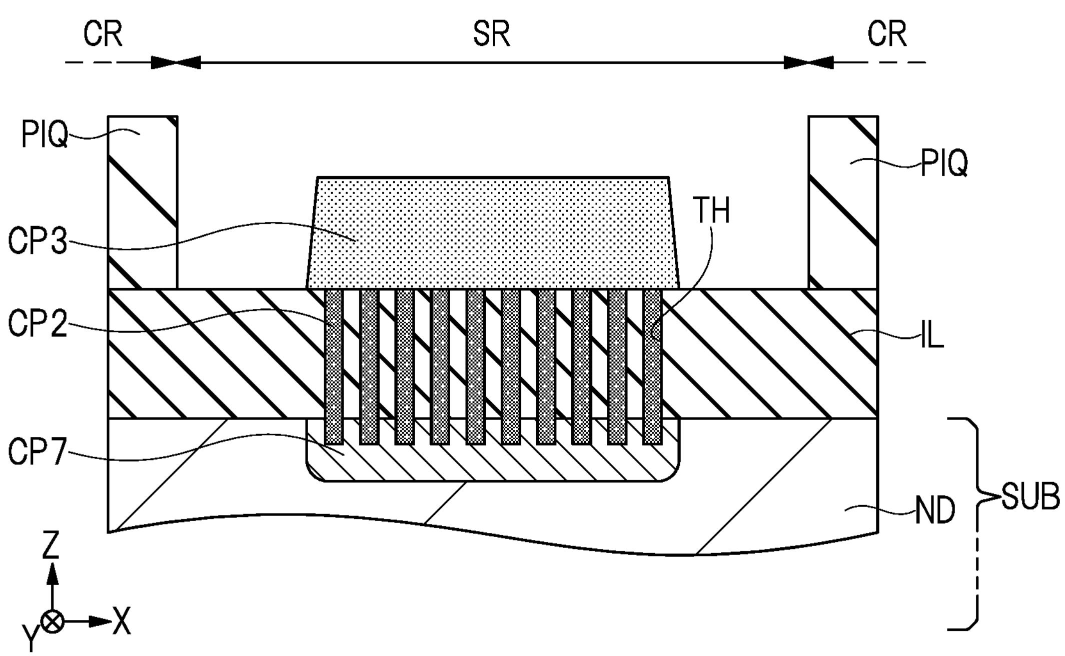
FIG. 33 is a sectional view showing a scribing region in a fourth embodiment.
Figure 34:
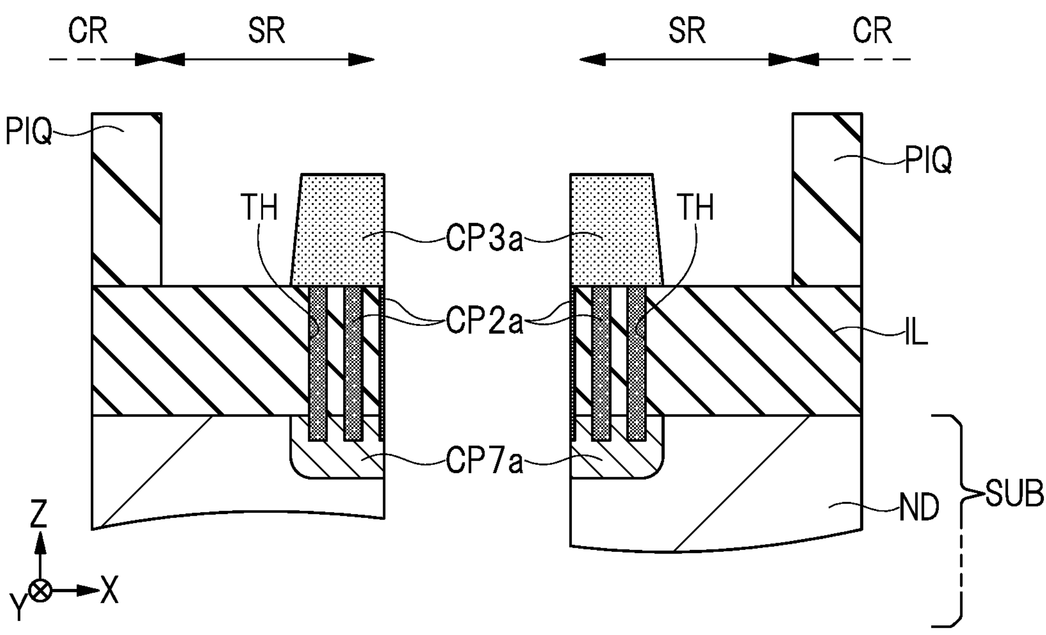
FIG. 34 is a sectional view showing a scribing region in the fourth embodiment.

Hereinafter, a semiconductor device 100 according to a fourth embodiment will be described below with reference to FIGS. 33 and 34. Incidentally, in the following description, a difference from the first embodiment will be mainly described, and a point overlapping with the first embodiment will be omitted.

In the first embodiment, the conductor pattern CP1 has been formed by using the polycrystalline silicon film SI. In a fourth embodiment, as shown in FIG. 33, instead of the conductor pattern CP1, a conductor pattern CP7, which is a p-type impurity region formed on the semiconductor substrate SUB, is applied.

Further, in the first embodiment, the conductor pattern CP1 has been electrically isolated from the semiconductor substrate SUB by the insulating film GF. In the third embodiment, by making a conductivity type of the conductor pattern CP7 opposite to conductivity type of the semiconductor substrate SUB (drift region ND), the conductor pattern CP7 can be electrically separated from the semiconductor substrate SUB.

Such a conductor pattern CP7 can be formed by the same step as the step of forming the floating region PF or the base region PB. Further, subsequent steps of forming the conductor pattern CP7 are the same as those in the first embodiment. Incidentally, as shown in FIG. 34, after the dicing step, a part of the conductor pattern CP7 is left in the scribing region SR as the conductor pattern piece CP7*a*.

Also in the fourth embodiment, since the conductor pattern piece CP3*a* can be prevented from being flown off (scattered), it is possible to improve the reliability of the semiconductor device 100 and suppress the decrease in yield of the semiconductor device 100.

Incidentally, techniques disclosed in the second and third embodiments can also be applied to a technique disclosed in the fourth embodiment.

Although the present invention has been specifically described above based on the above-described embodiments, the present invention is not limited to the above-described embodiments and can be variously modified without departing from the scope thereof.

For example, in the above-mentioned embodiments, the IGBT having a GG structure is exemplified as a transistor, but the IGBT may have a GGEE structure or an EGE structure. Further, the transistor is not limited to the IGBT, and may be a power MOSFET. Furthermore, the transistor is not limited to a trench gate type in which the gate electrode GE is embedded in the trench TR, and may be a planar type in which the gate electrode GE is formed on the semiconductor substrate SUB.

Further, in the above-mentioned embodiments, the transistor is exemplified as a semiconductor element formed in the chip region CR, but the semiconductor element may be a diode or a bipolar transistor formed on the semiconductor substrate SUB. Depending on the structure of the diode or bipolar transistor, the polycrystalline silicon film SI may not be used. For example, a technique such as the fourth embodiment can be suitably used in a semiconductor device 100 in which the polycrystalline silicon film SI is not used.

What is claimed is:

1. A method of manufacturing a semiconductor device, the method comprising:

(a) preparing a semiconductor substate having a first chip region, a second chip region, and a scribing region that is provided between the first and second chip regions and extends in a first direction in a plan view;

(b) forming a first conductor pattern via a first insulating film on the semiconductor substate of the scribing region;

(c) forming a second insulating film covering the first conductor pattern;

(d) forming a plurality of holes in the second insulating film so as to be located on the first conductor pattern;

(e) forming a plurality of second conductor patterns connected to the first conductor pattern in the plurality of holes;

(f) forming a third conductor pattern connected to the plurality of second conductor patterns on the second insulating film and on the plurality of second conductor patterns; and (g) cutting off the scribing region along the first direction by using a dicing blade so that a part of the scribing region is left in each outer periphery of the first chip region and the second chip region, wherein, in a second direction intersecting with the first direction as a plan view, a width of the dicing blade is narrower than a width of the first conductor pattern and a width of the third conductor pattern before the (g), wherein, after the (g), a part of the first conductor pattern, all or a part of at least one of the plurality of second conductor patterns, and a part of the third conductor pattern are left in each of the scribing region on a side of the first chip region and the scribing region on a side of the second chip region, wherein the (b) includes:

(b1) forming a trench in the semiconductor substrate of each of the first chip region and the second chip region;

(b2) forming the first insulating film in the trench and on the semiconductor substrate within the first chip region, in the trench and on the semiconductor substrate within the second chip region, and on the semiconductor substrate within the scribing region;

(b3) forming a polycrystalline silicon film on the first insulating film; and (b4) selectively patterning the polycrystalline silicon film, thereby forming a gate electrode in the first chip region and in the second chip region and forming the first conductor pattern on the semiconductor substrate in the scribing region, the gate electrode having an embedded electrode portion embedded in the trench, and a drawing portion located on the semiconductor substrate and electrically connected to the embedded electrode portion, wherein, in the (c), the second insulating film is formed in the first chip region and the second chip region so as to cover the gate electrode, wherein, in the (d), a via-hole is formed in the second insulating film within the first chip region and the second chip region so as to be located on the drawing portion on a side of the gate electrode, wherein, in the (e), a via connected to the drawing portion is formed in the via-hole within the first chip region and the second chip region, and wherein, in the (f), a gate wiring connected to the via is formed on the second insulating film and the via in the first chip region and the second chip region.

2. The method according to claim 1, wherein, in the second direction, a width of the first conductor pattern and a width of the third conductor pattern before the (g) are respectively twice or more than a width of the dicing blade.

3. The method according to claim 1, wherein, after the (g), a width of the first conductor pattern and a width of the third conductor pattern in the first direction are respectively wider than a width of the first conductor pattern and a width of the third conductor pattern in the second direction.

4. The method according to claim 1, wherein the plurality of holes extend in the first direction so that a width in the first direction is wider than a width of the second direction or extend in the second direction, or extend in the second direction so that a width in the second direction is wider than a width in the first direction.

5. The method according to claim 1, wherein the (b) includes:

(b1) forming a first conductor film on the first insulating film; and (b2) patterning the first conductor film, thereby forming the first conductor pattern on the first insulating film, and wherein the first conductor film contains a polycrystalline silicon film.

6. The method of manufacturing a semiconductor device according to claim 1, wherein the (e) and the (f) are performed as separate steps, the (e) includes:

(e1) forming a second conductor film in the plurality of holes and on the second insulating film; and (e2) removing the second conductor film outside the plurality of holes, thereby forming the plurality of second conductor patterns in the plurality of holes, and wherein the (f) includes:

(f1) forming a third conductor film on the second insulating film and on the plurality of second conductor patterns; and (f2) patterning the third conductor film on the second insulating film, thereby forming the third conductor pattern on the second insulating film and on the plurality of second conductor patterns.

7. The method according to claim 6, wherein the second conductor film contains a tungsten film, and wherein the third conductor film contains an aluminum film or an aluminum alloy film.

8. The method of manufacturing a semiconductor device according to claim 1, wherein the (e) and the (f) are performed as the same step, wherein, by forming a third conductor film in the plurality of holes and on the second insulating film and patterning the third conductor film located on the second insulating film, the plurality of second conductor patterns in the plurality of holes and the third conductor pattern on the second insulating film are integrally formed, and wherein the third conductor film contains an aluminum film or an aluminum alloy film.

9. The method according to claim 1, wherein the first conductor pattern, the plurality of second conductor patterns, and the third conductor pattern are provided as a measuring pad for causing the third conductor pattern to contact with an inspection terminal, wherein the scribing region is provided with two sets of measuring pads composed of the measuring pad, wherein, in a plan view, a fourth conductor pattern, a plurality of fifth conductor patterns, and a sixth conductor pattern are provided between the two sets of measuring pads, the fourth conductor pattern being formed on the same layer as that of the first conductor pattern, the plurality of fifth conductor patterns being connected to the fourth conductor pattern and being formed on the same layer as that of the plurality of second conductor patterns, the sixth conductor pattern being connected to the plurality of fifth conductor patterns and being formed on the same layer as that of the third conductor pattern, wherein the sixth conductor pattern is provided as an inspection element, and is electrically connected to at least one of the two sets of measuring pads, and wherein, after the (g), a part of the fourth conductor pattern, all or a part of at least one of the plurality of fifth conductor patterns, and a part of the sixth conductor pattern are left in each of the scribing region on a side of the first chip region and the scribing region on a side of the second chip region.

10. The method according to claim 1, wherein the third conductor pattern is provided with an alignment mark, and wherein the first conductor pattern, the plurality of holes, and the plurality of second conductor patterns are provided at such positions as not to overlap with the alignment mark in a plan view.

11. A method of manufacturing a semiconductor device, the method comprising:

(a) preparing a semiconductor substate having a first chip region, a second chip region, and a scribing region that is provided between the first and second chip regions and extends in a first direction in a plan view;

(b) forming a first conductor pattern via a first insulating film on the semiconductor substate of the scribing region;

(c) forming a second insulating film covering the first conductor pattern;

(d) forming a plurality of holes in the second insulating film so as to be located on the first conductor pattern;

(e) forming a plurality of second conductor patterns connected to the first conductor pattern in the plurality of holes;

(f) forming a third conductor pattern connected to the plurality of second conductor patterns on the second insulating film and on the plurality of second conductor patterns; and (g) cutting off the scribing region along the first direction by using a dicing blade so that a part of the scribing region is left in each outer periphery of the first chip region and the second chip region, wherein, in a second direction intersecting with the first direction as a plan view, a width of the dicing blade is narrower than a width of the first conductor pattern and a width of the third conductor pattern before the (g), wherein, after the (g), a part of the first conductor pattern, all or a part of at least one of the plurality of second conductor patterns, and a part of the third conductor pattern are left in each of the scribing region on a side of the first chip region and the scribing region on a side of the second chip region, wherein the (b) includes:

(b1) forming a trench in the semiconductor substrate of each of the first chip region and the second chip region;

(b2) forming the first insulating film in the trench and on the semiconductor substrate within the first chip region, in the trench and on the semiconductor substrate within the second chip region, and on the semiconductor substrate within the scribing region;

(b3) forming a polycrystalline silicon film on the first insulating film; and (b4) selectively pattering the polycrystalline silicon film, thereby forming, in the first chip region and the second chip region, a gate electrode embedded in the trench, and a resistance element formed on the semiconductor substrate and separated from the gate electrode, and forming the first conductor pattern on the semiconductor substrate in the scribing region, wherein, in the (c), the second insulating film is formed in the first chip region and the second chip region so as to cover the gate electrode and the resistance element, wherein, in the (d), a via-hole is formed in the second insulating film within the first chip region and the second chip region so as to be located on the gate electrode, wherein, in the (e), a via connected to the gate electrode is formed in the via-hole within the first chip region and the second chip region, and wherein, in the (f), a gate wing connected to the via is formed on the second insulating film and on the via within the first chip region and the second chip region.

12. A method of manufacturing a semiconductor device, the method comprising:

(a) preparing a semiconductor substrate with a first conductivity type, the semiconductor substrate having a first chip region, a second chip region, and a scribing region that is provided between the first chip region and the second chip region and extends in a first direction in a plan view;

(b) forming a seventh conductor pattern in the semiconductor substrate of the scribing region, the seventh conductor pattern having a second conductivity type opposite to the first conductivity type;

(c) forming a second insulating film so as to cover the seventh conductor pattern;

(d) forming a plurality of holes in the second insulating film so as to be located on the seventh conductor pattern;

(e) forming, in the plurality of holes, a plurality of second conductor patterns connected to the seventh conductor pattern;

(f) forming, on the second insulating film and the plurality of second conductor patterns, a third conductor pattern connected to the plurality of second conductor patterns; and (g) using a dicing blade to cut off the scribing region along the first direction so that a part of the scribing region is left on an outer periphery of each of the first chip region and the second chip region, wherein, in a second direction intersecting with the first direction in a plan view, a width of the dicing blade is narrower than a width of the seventh conductor pattern and a width of the third conductor pattern before the (g), and wherein, after the (g), a part of the seventh conductor pattern, at least one of the plurality of second conductor patterns, and a part of the third conductor pattern are left in each of the scribing region on a side of the first chip region and the scribing region on a side of the second chip region.

13. The method according to claim 12, wherein the (e) and the (f) are performed as separate steps, the (e) includes:

(e1) forming a first conductor film in the plurality of holes and on the second insulating film; and (e2) removing the first conductor film outside the plurality of holes, thereby forming the plurality of second conductor patterns in the plurality of holes, wherein the (f) includes:

(f1) forming a second conductor film on the second insulating film and the plurality of second conductor patterns; and (f2) patterning the second conductor film located on the second insulating film, thereby forming the second conductor pattern on the second insulating film and the plurality of second conductor patterns, wherein the first conductor film contains a tungsten film, and wherein the second conductor film contains an aluminum film or an aluminum alloy film.

14. The method according to claim 12, wherein the (e) and the (f) are performed as the same step, wherein, by forming a second conductor film in the plurality of holes and on the second insulating film and patterning the second conductor film located on the second insulating film, the plurality of second conductor patterns in the plurality of holes and the third conductor pattern on the second insulating film are integrally formed, and wherein the second conductor film contains an aluminum film or an aluminum alloy film.

* * * * *